US012575083B2

(12) United States Patent
Okajima et al.

(10) Patent No.: US 12,575,083 B2
(45) Date of Patent: Mar. 10, 2026

(54) SEMICONDUCTOR DEVICE AND SEMICONDUCTOR MEMORY DEVICE

(71) Applicant: Kioxia Corporation, Minato-Ku (JP)

(72) Inventors: Mutsumi Okajima, Yokkaichi Mie (JP); Nobuyoshi Saito, Ota Tokyo (JP); Keiji Ikeda, Kawasaki Kanagawa (JP); Kotaro Noda, Yokkaichi Mie (JP); Takanori Akita, Yokkaichi Mie (JP)

(73) Assignee: KIOXIA CORPORATION, Minato-Ku (JP)

( * ) Notice: Subject to any disclaimer, the term of this patent is extended or adjusted under 35 U.S.C. 154(b) by 682 days.

(21) Appl. No.: 17/901,772

(22) Filed: Sep. 1, 2022

(65) Prior Publication Data

US 2023/0309294 A1 Sep. 28, 2023

(30) Foreign Application Priority Data

Mar. 22, 2022 (JP) ................................. 2022-045940

(51) Int. Cl.
H10B 12/00 (2023.01)
(52) U.S. Cl.
CPC ............. H10B 12/33 (2023.02); H10B 12/05 (2023.02); H10B 12/50 (2023.02)
(58) Field of Classification Search
CPC ...... H10B 12/05; H10B 12/31; H10B 12/315; H10B 12/488; H10B 12/30; H10B 12/33; H10B 12/482; H10B 12/03; H10B 12/033; H10B 12/036; H10B 12/34; H10B 12/485; H10B 53/10; H10B 53/20
See application file for complete search history.

(56) References Cited

U.S. PATENT DOCUMENTS

| | | | | |
|---|---|---|---|---|
| 10,355,002 | B2* | 7/2019 | Sills | .................. H01L 21/76897 |
| 10,424,671 | B2* | 9/2019 | Yamazaki | .............. H10B 12/33 |
| 11,024,719 | B2 | 6/2021 | Sawabe et al. | |
| 11,094,698 | B2 | 8/2021 | Inaba | |
| 2018/0218765 | A1* | 8/2018 | Derner | ................ G11C 11/4085 |

(Continued)

FOREIGN PATENT DOCUMENTS

| | | |
|---|---|---|
| JP | 2021-108331 A | 7/2021 |
| JP | 2021-114563 A | 8/2021 |

(Continued)

*Primary Examiner* — Edward Chin
(74) *Attorney, Agent, or Firm* — Foley & Lardner LLP

(57) ABSTRACT

A semiconductor device includes: an oxide semiconductor layer extending in a first direction; a gate electrode overlapping the oxide semiconductor layer in a second direction intersecting the first direction; a gate insulating film provided between the gate electrode and the oxide semiconductor layer; a first conductive layer provided on the oxide semiconductor layer in the first direction and containing a conductive oxide; a second conductive layer provided on the first conductive layer in the first direction and containing a metal element; a first protective film in contact with a side surface of the second conductive layer; and a second protective film in contact with at least a part of a side surface or an upper surface of the first conductive layer. The first protective film and the second protective film each contain a material having an oxygen diffusion coefficient smaller than that of the second conductive layer.

22 Claims, 39 Drawing Sheets

(56) References Cited

U.S. PATENT DOCUMENTS

2019/0296155 A1 * 9/2019 Sawabe ................. H10B 12/31
2021/0225847 A1 7/2021 Wada et al.
2021/0249540 A1 8/2021 Hattori et al.

FOREIGN PATENT DOCUMENTS

JP 2021-125615 A 8/2021
WO WO-2021/106090 A1 6/2021

* cited by examiner

*FIG. 1*

FIG. 5
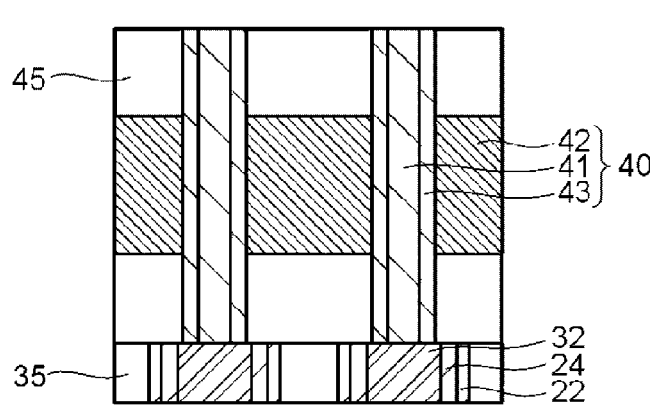
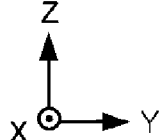
FIG. 6
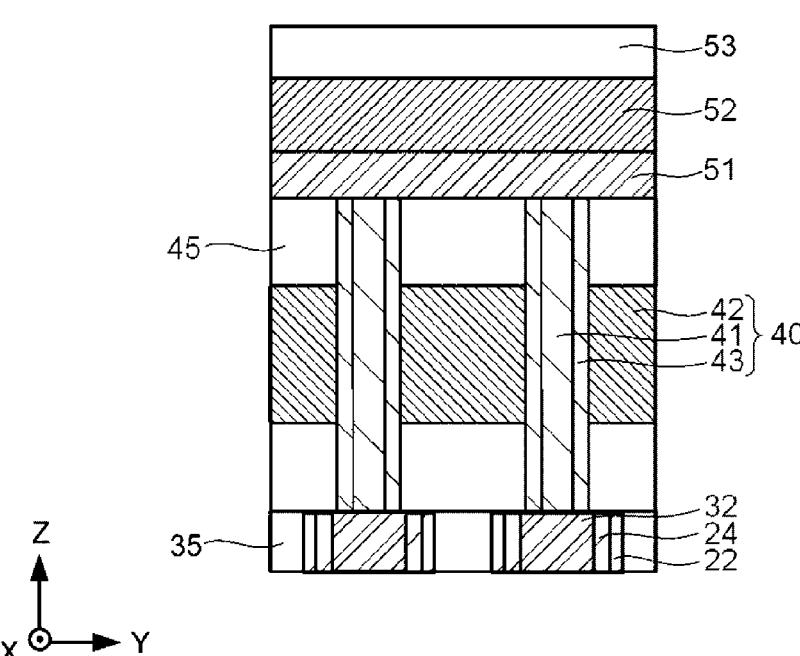

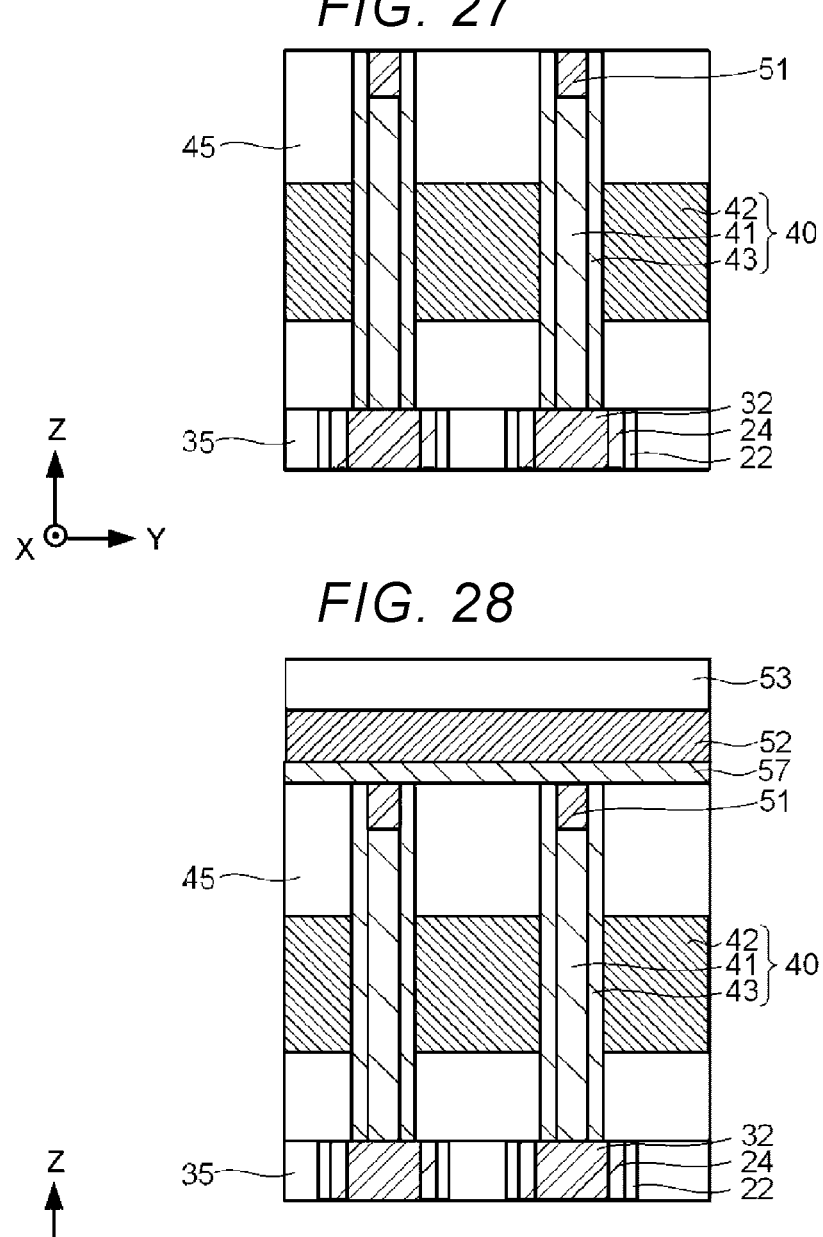

SEMICONDUCTOR DEVICE AND SEMICONDUCTOR MEMORY DEVICE

CROSS-REFERENCE TO RELATED APPLICATION(S)

This application is based upon and claims the benefit of priority from Japanese Patent Application No. 2022-045940, filed Mar. 22, 2022, the entire contents of which are incorporated herein by reference.

FIELD

Embodiments described herein relate generally to a semiconductor device and a semiconductor memory device.

BACKGROUND

A semiconductor memory device including bit lines, word lines, and memory cells (transistors and capacitors) connected thereto is used. Data can be written in and read from the memory cells by selecting the bit lines and the word lines and applying a voltage.

DESCRIPTION OF THE DRAWINGS

FIG. 1 is a circuit diagram illustrating a circuit configuration example of a memory cell array.

FIG. 5 is a cross-sectional schematic view illustrating a manufacturing method example of the first structural example.

FIG. 6 is a cross-sectional schematic view illustrating the manufacturing method example of the first structural example.

FIG. 7 is a cross-sectional schematic view illustrating the manufacturing method example of the first structural example.

FIG. 8 is a cross-sectional schematic view illustrating the manufacturing method example of the first structural example.

FIG. 27 is a cross-sectional schematic view illustrating the manufacturing method example of the fourth structural example.

FIG. 28 is a cross-sectional schematic view illustrating the manufacturing method example of the fourth structural example.

DETAILED DESCRIPTION

Figure 2:
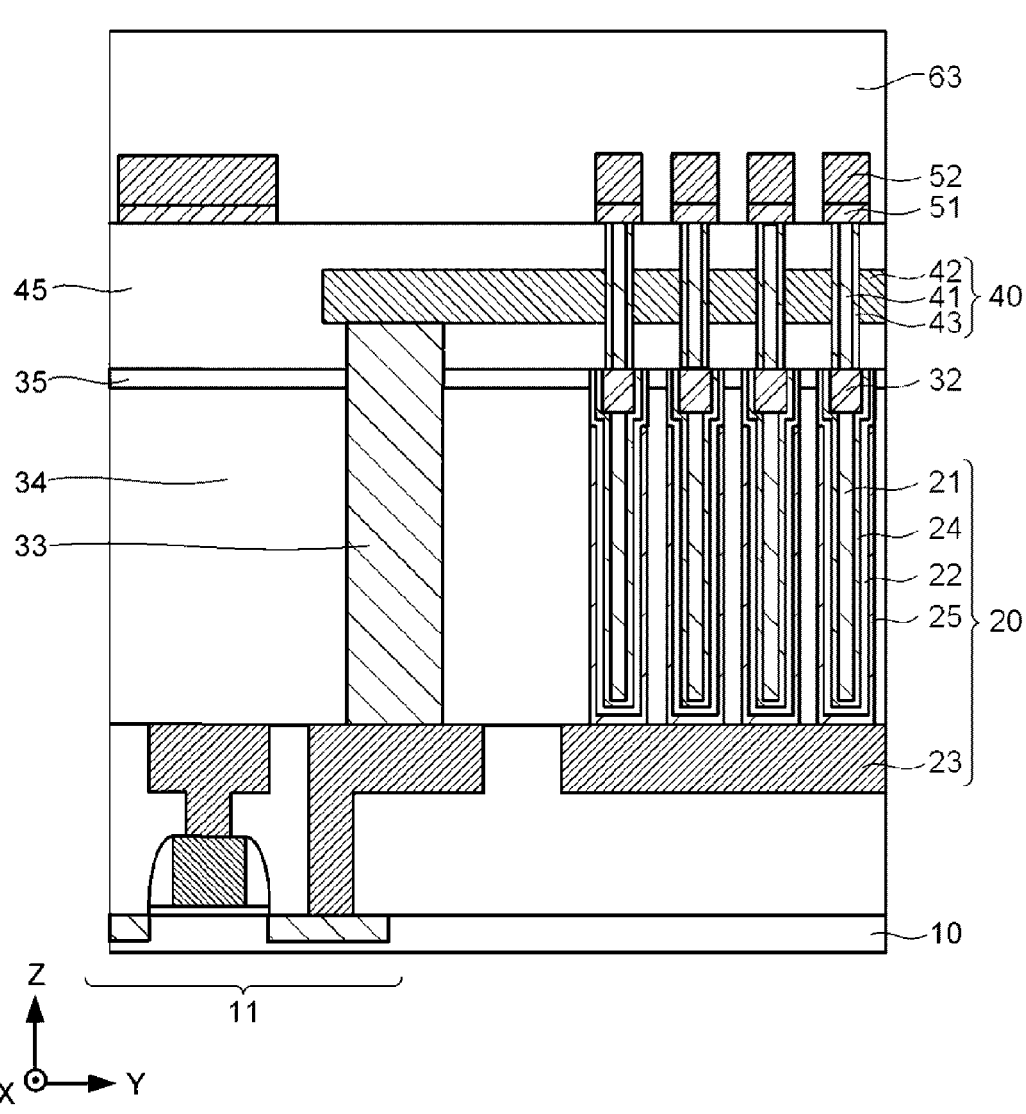
FIG. 2 is a cross-sectional schematic view illustrating a structural example of a semiconductor memory device.

At least one embodiment provides a semiconductor device and a semiconductor memory device that prevent a decrease in reliability.

In general, according to at least one embodiment, the semiconductor device includes: an oxide semiconductor layer extending in a first direction; a gate electrode overlapping the oxide semiconductor layer in a second direction intersecting the first direction; a gate insulating film provided between the gate electrode and the oxide semiconductor layer; a first conductive layer provided on the oxide semiconductor layer in the first direction and containing a conductive oxide; a second conductive layer provided on the first conductive layer in the first direction and containing a metal element; a first protective film in contact with a side surface of the second conductive layer; and a second protective film in contact with at least a part of a side surface or an upper surface of the first conductive layer. The first protective film and the second protective film each contain a material having an oxygen diffusion coefficient smaller than that of the second conductive layer.

Hereinafter, embodiments will be described with reference to the drawings. A relation between a thickness and a planar dimension of each component illustrated in the drawings, a ratio of the thickness of each component, and the like may be different from those of an actual product. A vertical direction may be different from a vertical direction according to a gravitational acceleration. In addition, in the embodiments, substantially the same components are denoted by the same reference signs, and descriptions are appropriately omitted.

In the present specification, "connection" includes not only physical connection but also electrical connection, and includes not only direct connection but also indirect connection unless otherwise specified.

A semiconductor memory device according to at least one embodiment is a dynamic random access memory (DRAM) and includes a memory cell array.

Figure 1:
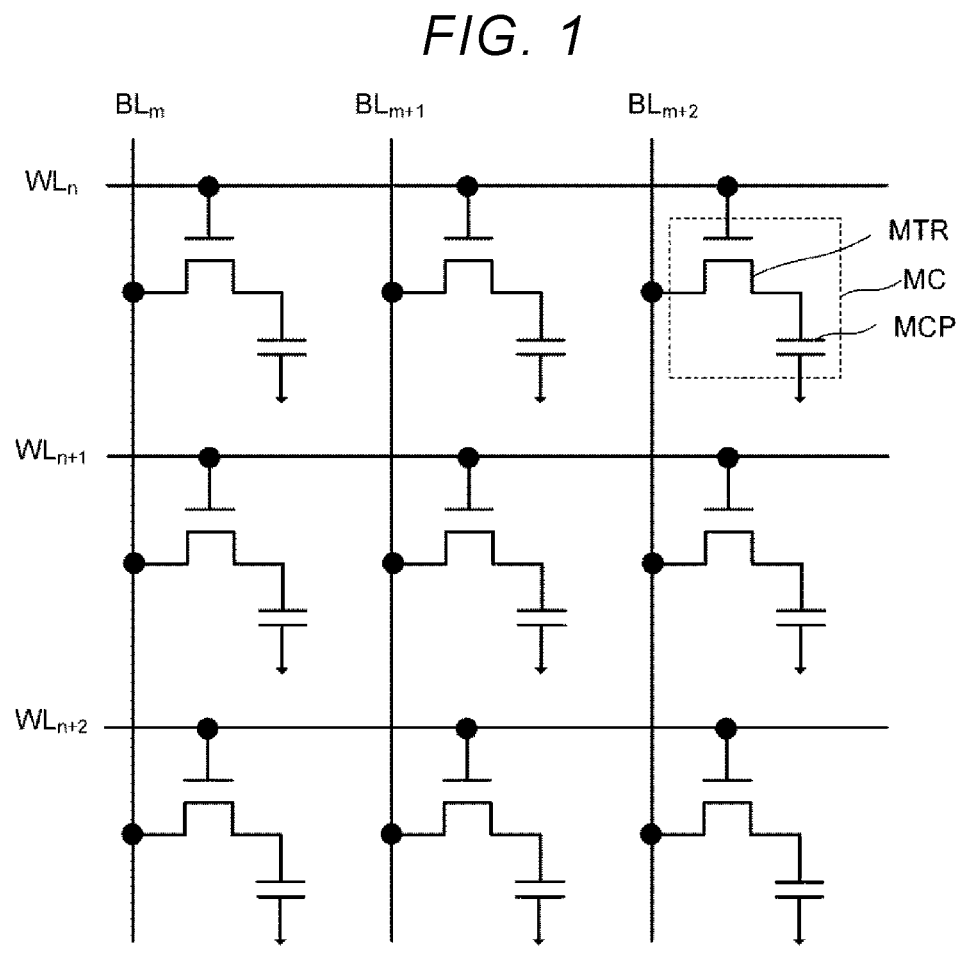

FIG. 1 is a circuit diagram illustrating a circuit configuration example of the memory cell array. FIG. 1 illustrates a plurality of memory cells MC, a plurality of word lines WLs (word line $WL_n$, word line $WL_{n+1}$, and word line $WL_{n+2}$, and n is an integer), and a plurality of bit lines BLs (bit line $BL_m$, bit line $BL_{m+1}$, and bit line $BL_{m+2}$, and m is an integer).

The plurality of memory cells MCs are arranged in a matrix direction to form the memory cell array. Each memory cell MC includes a memory transistor MTR that is a field effect transistor (FET) and a memory capacitor MCP. A gate of the memory transistor MTR is connected to a corresponding word line WL, and one of a source electrode or a drain electrode is connected to a corresponding bit line BL. One electrode of the memory capacitor MCP is connected to the other of the source electrode or the drain electrode of the memory transistor MTR, and the other electrode is connected to a power supply line (not shown) for supplying a specific voltage. The memory cell MC can store data by accumulating charges from the bit line BL to the memory capacitor MCP by switching the memory transistor MTR by the word line WL. The number of memory cells MCs is not limited to the number illustrated in FIG. 1.

FIG. 2 is a cross-sectional schematic view illustrating a structural example of the semiconductor memory device, and illustrates a part in a Y-Z cross section including a Y axis and a Z axis orthogonal to the Y axis of the semiconductor memory device.

The semiconductor memory device illustrated in FIG. 2 includes a semiconductor substrate 10, a circuit 11, an electric conductor 21, an insulating film 22, a conductor 23, an electric conductor 24, an electric conductor 25, a conductive oxide layer 32, a conductor 33, an insulating layer 34, an insulating layer 35, an oxide semiconductor layer 41, a conductive layer 42, an insulating layer 43, an insulating layer 45, a conductive oxide layer 51, a conductive layer 52, and an insulating layer 63.

The circuit 11 constitutes, for example, a peripheral circuit of a sense amplifier or the like. The circuit 11 includes a field effect transistor such as a P-channel field effect transistor (Pch-FET) and an N-channel field effect transistor (Nch-FET). The field effect transistor of the circuit 11 may be formed using, for example, the semiconductor substrate 10 such as a single crystal silicon substrate. The Pch-FET and the Nch-FET each have a channel region, a source region, and a drain region in the semiconductor substrate 10. It should be noted that the semiconductor substrate 10 may have a P-type conductivity. For convenience, FIG. 2 illustrates the field effect transistor of the circuit 11.

The electric conductor 21, the insulating film 22, the electric conductor 24, and the electric conductor 25 form a capacitor 20. The capacitor 20 is the memory capacitor MCP of the memory cell MC. Four capacitors 20 are illustrated in FIG. 2, and the number of capacitors 20 is not limited to four.

The capacitor 20 is a three-dimensional capacitor such as a pillar type capacitor or a cylinder type capacitor. The electric conductor 21 functions as a first electrode of the memory capacitor MCP. The insulating film 22 functions as a dielectric layer of the memory capacitor MCP. The conductor 23 functions as a second electrode of the memory capacitor MCP. The electric conductor 24 is provided between the electric conductor 21 and the insulating film 22. The electric conductor 25 is provided between the insulating film 22 and the insulating layer 34 and between the insulating film 22 and the conductor 23.

The electric conductor 21 contains, for example, a material such as amorphous silicon. The insulating film 22 contains, for example, a material such as hafnium oxide. The conductor 23, the electric conductor 24, and the electric conductor 25 contain, for example, a material such as tungsten and titanium nitride.

The conductive oxide layer 32 is provided on the electric conductor 21. The conductive oxide layer 32 contains, for example, a metal oxide such as indium-tin-oxide (ITO).

The conductor 33 is electrically connected to the circuit 11. The conductor 33 functions as a via. The conductor 33 contains, for example, copper.

The insulating layer 34 is provided, for example, among the plurality of capacitors 20. The insulating layer 34 contains, for example, silicon and oxygen.

The insulating layer 35 is provided on the insulating layer 34. The insulating layer 35 contains, for example, silicon and nitrogen.

The oxide semiconductor layer 41, the conductive layer 42, and the insulating layer 43 form a field effect transistor 40. The field effect transistor 40 is the memory transistor MTR of the memory cell MC. The field effect transistor 40 is provided on the capacitor 20.

The oxide semiconductor layer 41 is, for example, a columnar body extending in a Z-axis direction. The oxide semiconductor layer 41 forms a channel of the field effect transistor 40. The oxide semiconductor layer 41 contains, for example, indium (In). The oxide semiconductor layer 41 contains, for example, indium oxide and gallium oxide, indium oxide and zinc oxide, or indium oxide and tin oxide. As an example, the oxide semiconductor layer 41 contains an oxide containing indium, gallium, and zinc (indium-gallium-zinc-oxide), so-called IGZO (InGaZnO).

One end of the oxide semiconductor layer 41 in the Z-axis direction is connected to the conductive layer 52 via the conductive oxide layers 51 and functions as one of a source electrode or a drain electrode of the field effect transistor 40, and the other end is connected to the conductive oxide layer 32 and functions as the other of the source electrode or the drain electrode of the field effect transistor 40. At this time, the conductive oxide layer 32 is provided between the electric conductor 21 of the capacitor 20 and the oxide semiconductor layer 41 of the field effect transistor 40, and functions as the other of the source electrode or the drain electrode of the field effect transistor 40. The conductive oxide layer 32 contains a metal oxide similar to the oxide semiconductor layer 41 of the field effect transistor 40, and thus connection resistance between the field effect transistor 40 and the conductive oxide layer 32 can be reduced.

The conductive layer 42 extends in a Y-axis direction. The conductive layer 42 overlaps the oxide semiconductor layer 41 with the insulating layer 43 interposed therebetween in an X-Y plane. The conductive layer 42 forms a gate electrode of the field effect transistor 40 and forms the word line WL. The conductive layer 42 contains, for example, a metal, a metal compound, or a semiconductor. The conductive layer 42 contains, for example, at least one material selected from a group including tungsten (W), titanium (Ti), titanium nitride (TiN), molybdenum (Mo), cobalt (Co), and ruthenium (Ru). The conductive layer 42 is connected to the conductor 33.

The insulating layer 43 is provided between the oxide semiconductor layer 41 and the conductive layer 42 in the X-Y plane. The insulating layer 43 forms a gate insulating film of the field effect transistor 40. The insulating layer 43 contains, for example, silicon, oxygen, or nitrogen.

The field effect transistor 40 is a so-called surrounding gate transistor (SGT) in which the gate electrode surrounds the channel. By the SGT, an area of the semiconductor memory device can be reduced.

A field effect transistor including a channel layer containing an oxide semiconductor has an off-leak current lower than that of a field effect transistor provided on the semiconductor substrate 10. Therefore, for example, data stored in the memory cell MC can be stored for a long time, and thus the number of times of a refresh operation can be reduced. In addition, the field effect transistor including the channel layer containing the oxide semiconductor can be formed by a low-temperature process, and thus it is possible to prevent application of thermal stress to the capacitor 20.

The insulating layer 45 is provided, for example, among a plurality of field effect transistors 40. The insulating layer 45 contains, for example, silicon and oxygen.

The conductive oxide layer 51 is provided on the oxide semiconductor layer 41. The conductive oxide layer 51 is a conductive layer containing a conductive oxide. The conductive oxide layer 51 contains, for example, a metal oxide such as indium-tin-oxide (ITO).

The conductive oxide layer 51 is provided in contact with the oxide semiconductor layer 41 of the field effect transistor 40, and functions as the one of the source electrode or the drain electrode of the field effect transistor 40. The conductive oxide layer 51 contains, for example, a metal oxide such as indium-tin-oxide (ITO). The conductive oxide layer 51 contains a metal oxide similar to the oxide semiconductor layer 41, and thus connection resistance between the field effect transistor 40 and the conductive oxide layer 51 can be reduced.

The conductive layer 52 is provided on at least a part of the conductive oxide layer 51. The conductive layer 52 forms an electrode (not shown) electrically connected to the bit line BL. The conductive layer 52 contains a metal element. The conductive layer 52 contains, for example, a material such as tungsten and titanium nitride.

The conductive layer 52 is provided in contact with the conductive oxide layer 51 above the field effect transistor 40, and is connected to the oxide semiconductor layer 41 of the field effect transistor 40 via the conductive oxide layer 51. The conductive oxide layer 51 functions as the one of the source electrode or the drain electrode of the field effect transistor 40. The conductive layer 52 is electrically connected to the sense amplifier in the circuit 11 via the bit line BL.

The insulating layer 63 is provided, for example, between layers including the conductive oxide layer 51 and the conductive layer 52. The insulating layer 63 contains, for example, silicon and oxygen.

Figure 3:
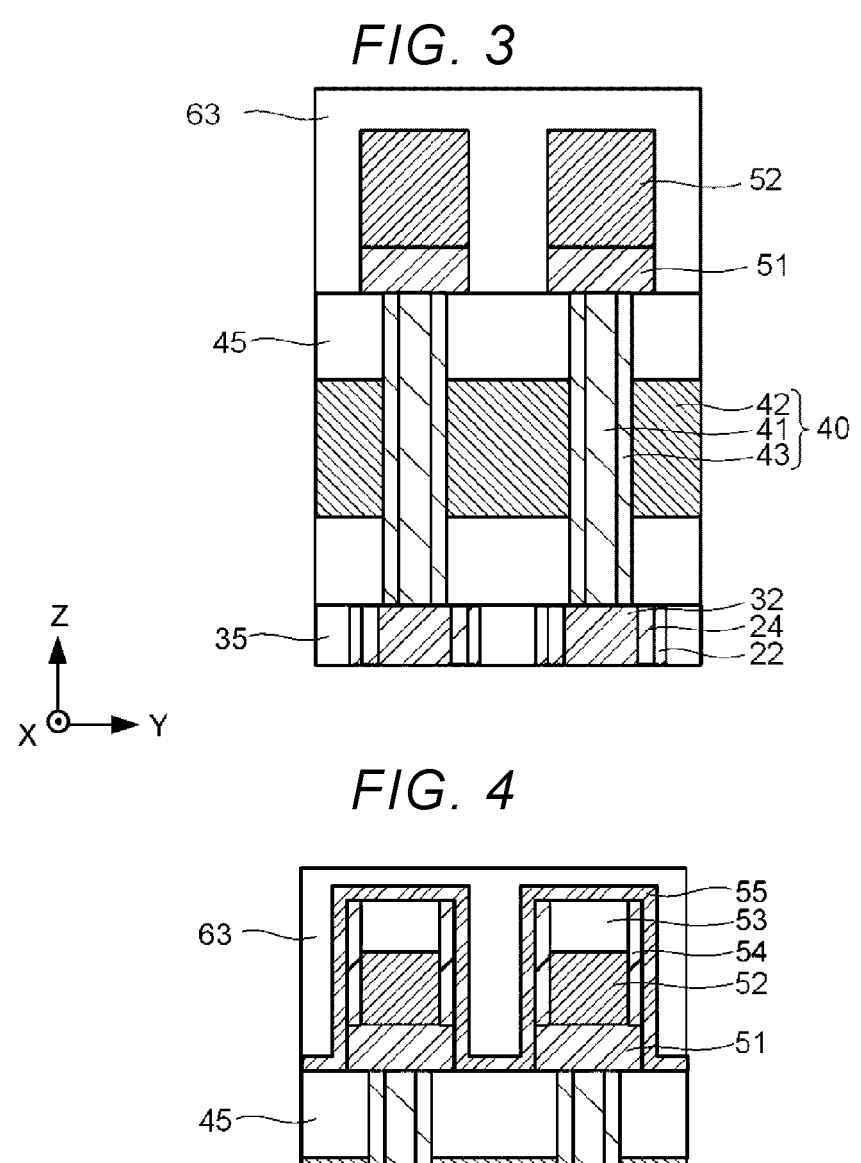
FIG. 3 is a cross-sectional schematic view illustrating a structural example of the memory cell array.

FIG. 3 is a cross-sectional schematic view illustrating a structural example of the memory cell array and is a partial enlarged view of FIG. 2. In the case of the structural example illustrated in FIG. 3, oxygen may release from the oxide semiconductor layer 41 via the conductive oxide layer 51 in a subsequent process. In addition, in the case of the structural example illustrated in FIG. 3, the conductive layer 52 is easily oxidized. As a result, an operation failure of the field effect transistor 40 may occur, and reliability of the semiconductor memory device is decreased.

In this regard, the memory cell array of the semiconductor memory device according to at least one embodiment includes at least one protective film that protects at least one of the conductive oxide layer 51 and the conductive layer 52. Accordingly, a decrease in the reliability of the semiconductor memory device can be prevented. Hereinafter, specific structural examples of the memory cell array including the protective film will be described.

First Structural Example of Memory Cell Array

Figure 4:
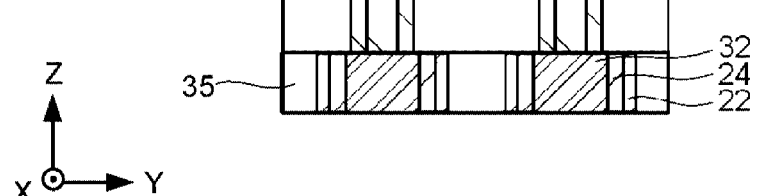
FIG. 4 is a cross-sectional schematic view illustrating a first structural example of the memory cell array.

FIG. 4 is a cross-sectional schematic view illustrating a first structural example of the memory cell array. A part of a Y-Z cross section of the memory cell array is illustrated in FIG. 4. The memory cell array illustrated in FIG. 4 further includes an insulating layer 53, a protective film 54, and a protective film 55 in addition to the components illustrated in FIG. 3. For the same portions as those in FIGS. 2 and 3, the descriptions of FIGS. 2 and 3 is applicable as appropriate.

The insulating layer 53 is provided on the conductive layer 52. The insulating layer 53 contains, for example, silicon and oxygen. The insulating layer 53 may not necessarily be provided.

The protective film 54 is in contact with a side surface of the conductive layer 52 and a side surface of the insulating layer 53. The protective film 54 is also in contact with an upper surface of the conductive oxide layer 51 partially. It is preferable that the protective film 54 has an oxygen diffusion coefficient smaller than that of the conductive layer 52 and the conductive oxide layer 51. Accordingly, oxidation of the conductive layer 52 can be prevented. The protective film 54 contains silicon and at least one of oxygen or nitrogen, or contains oxygen and at least one of titanium, ruthenium, and iridium.

The protective film 55 is in contact with a side surface of the conductive oxide layer 51, a side surface of the protective film 54, and an upper surface of the insulating layer 53. It is preferable that the protective film 55 has an oxygen diffusion coefficient smaller than that of the conductive layer 52 and the conductive oxide layer 51. Accordingly, it is possible to prevent oxygen from being released from the oxide semiconductor layer 41 via the conductive oxide layer 51. The protective film 55 contains silicon and at least one of oxygen or nitrogen, or contains oxygen and at least one of titanium, ruthenium, and iridium.

Next, a manufacturing method example of the first structural example will be described with reference to FIGS. 5 to 12. FIGS. 5 to 12 are cross-sectional schematic views illustrating the manufacturing method example of the first structural example, and illustrate a Y-Z cross section. Here, a manufacturing process from formation of the field effect transistor 40 to formation of the insulating layer 63 will be described.

First, as illustrated in FIG. 5, after the field effect transistor 40 is formed, the conductive oxide layer 51, the conductive layer 52, and the insulating layer 53 are sequentially formed as illustrated in FIG. 6. The conductive oxide layer 51 and the conductive layer 52 may be formed by, for example, sputtering or an atomic layer deposition method (ALD). The insulating layer 53 may be formed by, for example, a chemical vapor deposition method (CVD).

Figures 7, 8:
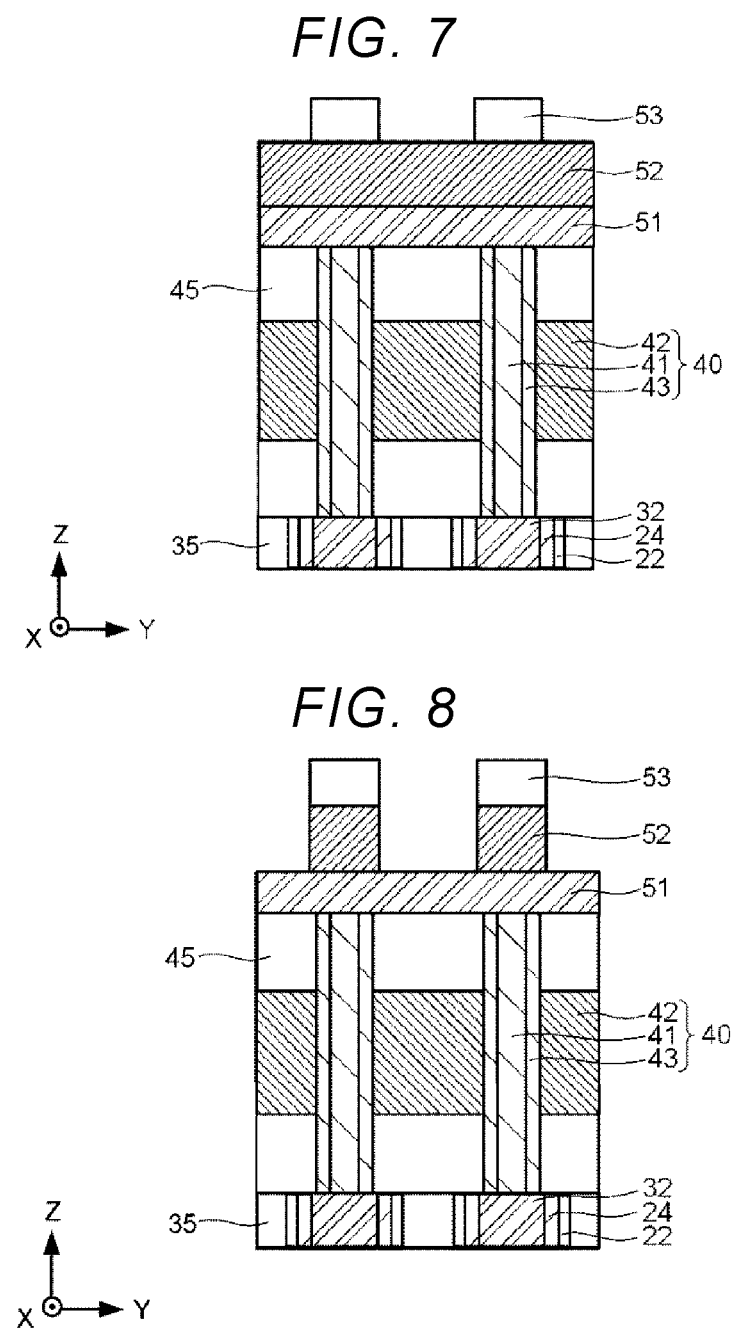

Next, as illustrated in FIG. 7, the insulating layer 53 is processed to expose a part of the conductive layer 52. The insulating layer 53 may be processed by forming a mask on a part of the insulating layer 53 using, for example, a photolithography technique and partially removing an exposed portion of the insulating layer 53 by etching using the mask. Examples of the etching include dry etching, wet etching, and the like.

Next, as illustrated in FIG. 8, an exposed portion of the conductive layer 52 is removed by etching using the insulating layer 53 as a mask, so as to expose a part of the conductive oxide layer 51. Examples of the etching include dry etching, wet etching, and the like.

Figures 9, 10:
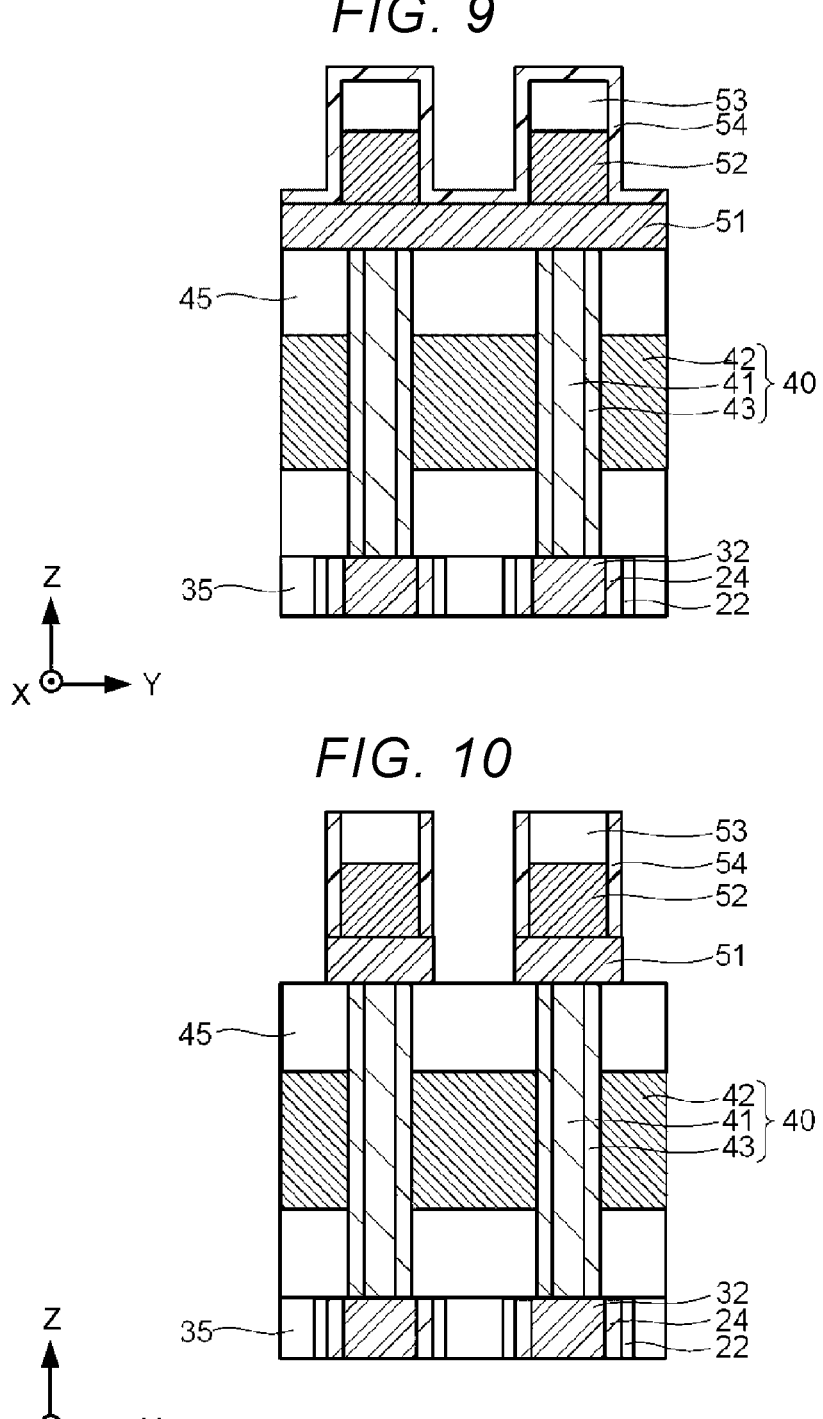
FIG. 9 is a cross-sectional schematic view illustrating the manufacturing method example of the first structural example.
FIG. 10 is a cross-sectional schematic view illustrating the manufacturing method example of the first structural example.

Next, as illustrated in FIG. 9, the protective film 54 that covers the conductive oxide layer 51, the conductive layer 52, and the insulating layer 53 is formed. The protective film 54 may be formed using, for example, CVD and ALD.

Next, as illustrated in FIG. 10, by removing a part of the protective film 54 in a thickness direction, a part of the conductive oxide layer 51 is exposed while the other part of the protective film 54 in contact with the side surface of the insulating layer 53 and the side surface of the conductive layer 52 is remained, and then, an exposed portion of the conductive oxide layer 51 is removed. The protective film 54 may be partially removed by, for example, reactive ion etching (RIE). The conductive oxide layer 51 may be partially removed by, for example, reactive ion etching, dry etching, or wet etching.

Thereafter, by performing a heat treatment in an oxidizing atmosphere, oxygen can be introduced into the oxide semiconductor layer 41 via the conductive oxide layer 51. The oxidizing atmosphere contains, for example, oxygen, ozone, or water vapor. Further, the heat treatment may be performed under a nitrogen atmosphere.

Figure 11:
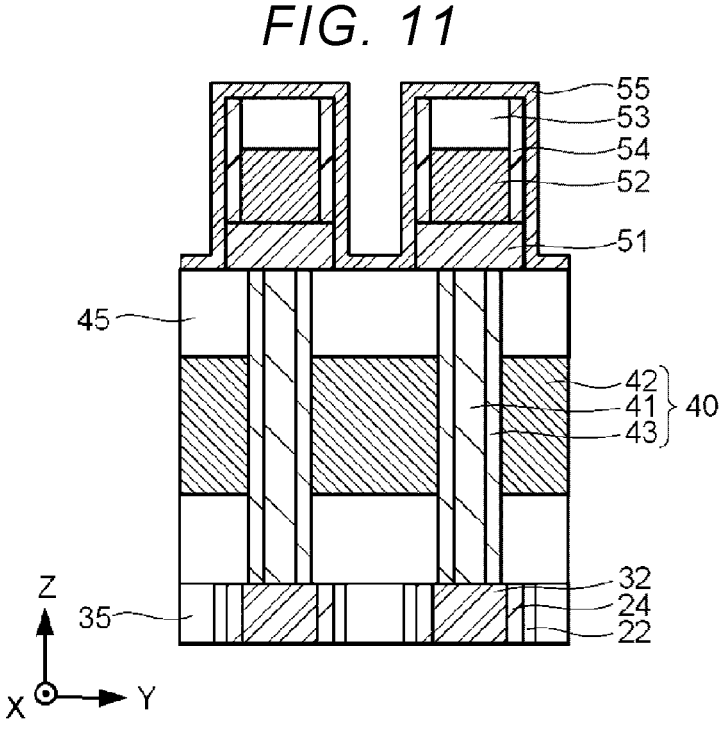
FIG. 11 is a cross-sectional schematic view illustrating the manufacturing method example of the first structural example.

Next, as illustrated in FIG. 11, the protective film 55 that covers the side surface of the conductive oxide layer 51 is formed. By forming the protective film 55, it is possible to prevent oxygen from being released from the oxide semiconductor layer 41 after the heat treatment. The protective film 55 may be formed using, for example, CVD and ALD. The protective film 55 is formed to also cover the side surface of the protective film 54 and the upper surface of the insulating layer 53.

Figure 12:
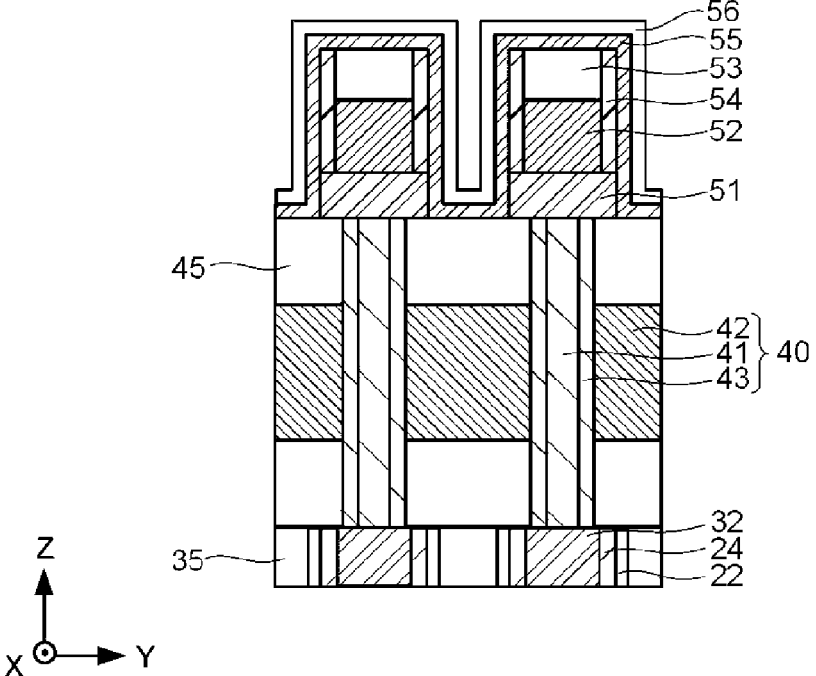
FIG. 12 is a cross-sectional schematic view illustrating the manufacturing method example of the first structural example.

As illustrated in FIG. 12, a protective film 56 may be formed on the protective film 55. The protective film 56 contains, for example, aluminum and oxygen. It is preferable that the protective film 56 has an oxygen diffusion coefficient smaller than that of the conductive layer 52 and the conductive oxide layer 51. By forming the protective film 56, it is possible to prevent hydrogen from intruding into the conductive oxide layer 51 in a subsequent process, for example. The protective film 56 may be formed using, for example, CVD, sputtering, or ALD.

Thereafter, the insulating layer 63 is formed. A known method may be used as a method for forming other components. The above is the description of the manufacturing method example of the first structural example.

Second Structural Example of Memory Cell Array

Figures 13, 14:
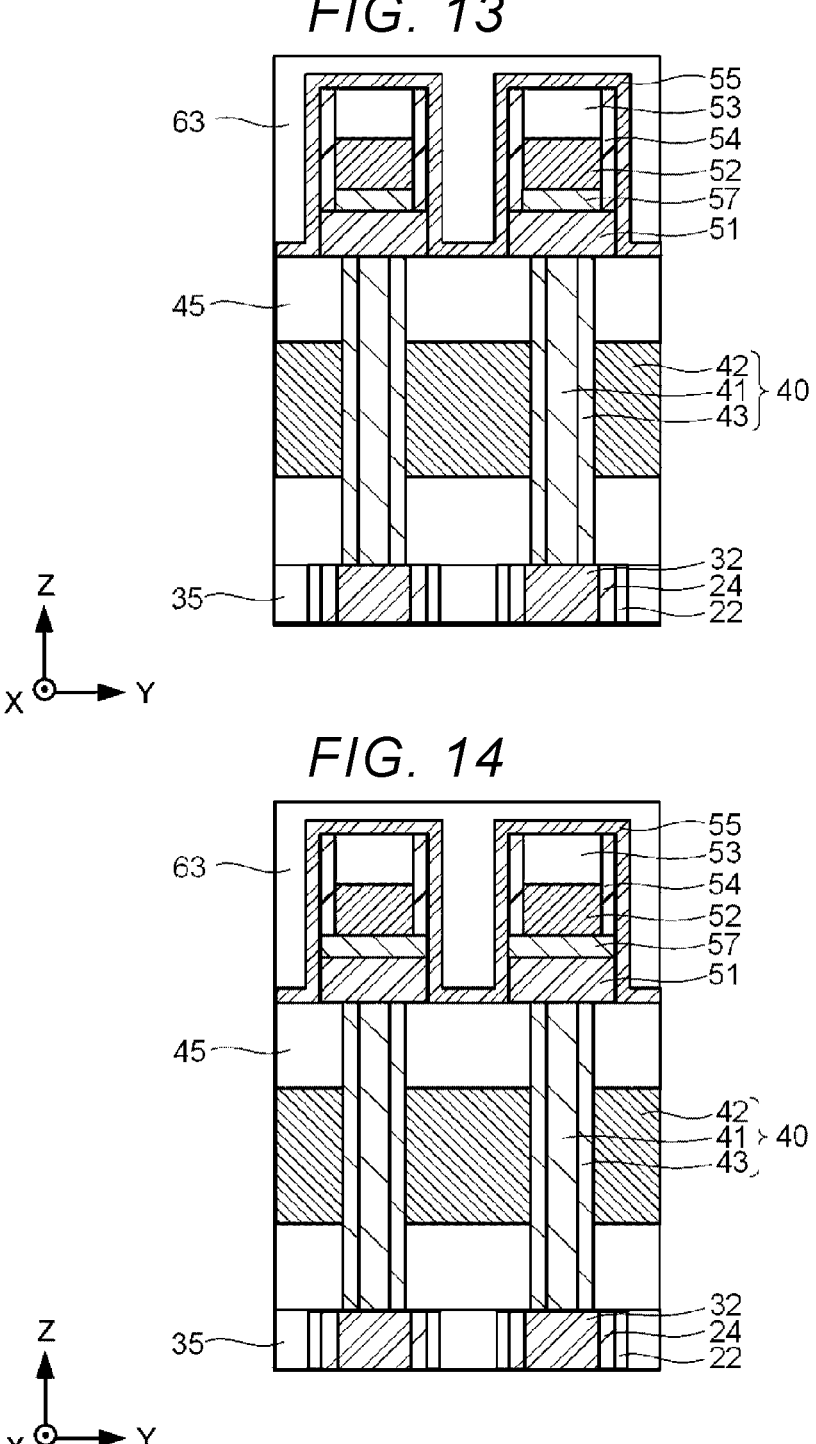
FIG. 13 is a cross-sectional schematic view illustrating a second structural example of the memory cell array.
FIG. 14 is a cross-sectional schematic view illustrating the second structural example of the memory cell array.

FIGS. 13 and 14 are cross-sectional schematic views illustrating a second structural example of the memory cell array. The memory cell arrays illustrated in FIGS. 13 and 14 further include a conductive layer 57 in addition to the components illustrated in FIG. 4. For the same portions as those in FIG. 4, the description of FIG. 4 is applicable as appropriate.

The conductive layer 57 is provided between the conductive oxide layer 51 and the conductive layer 52. The conductive layer 57 is, for example, a metal compound layer, and contains, for example, titanium and nitrogen. By forming the conductive layer 57, it is possible to prevent diffusion of oxygen from the conductive oxide layer 51 to the conductive layer 52.

The side surface of the conductive layer 52 and a side surface of the conductive layer 57 illustrated in FIG. 13 are in contact with the protective film 54, while the present example is not limited thereto, and as illustrated in FIG. 14, the conductive layer 52 may be provided on a part of the conductive layer 57, and the side surface of the conductive layer 52 is in contact with the protective film 54, and the side surface of the conductive layer 57 may be in contact with the protective film 55. Accordingly, a contact area between the conductive oxide layer 51 and the conductive layer 57 can be increased.

Figures 15, 16:
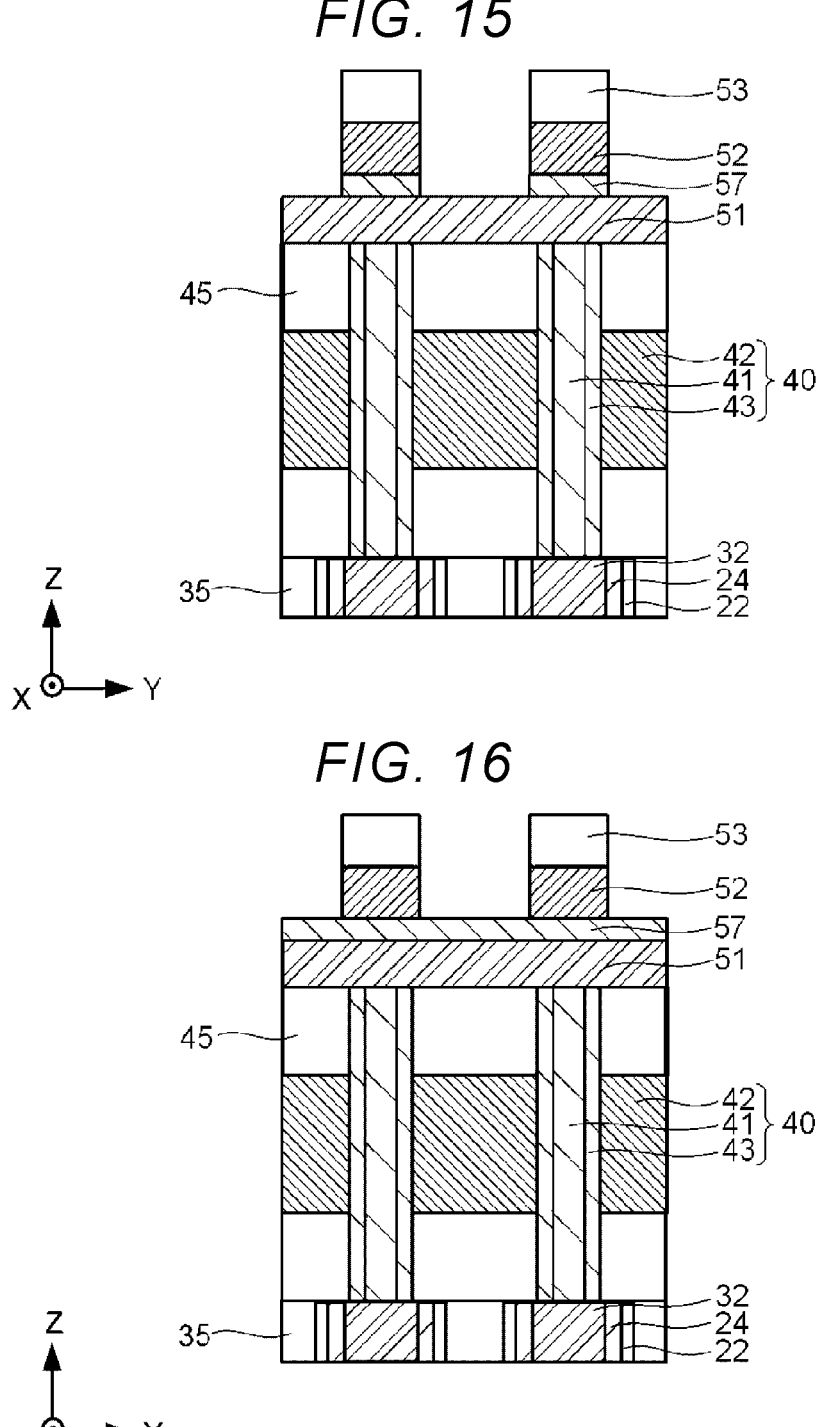
FIG. 15 is a cross-sectional schematic view illustrating a manufacturing method example of the second structural example.
FIG. 16 is a cross-sectional schematic view illustrating the manufacturing method example of the second structural example.

Next, a manufacturing method example of the second structural example will be described with reference to FIGS. 15 and 16. FIGS. 15 and 16 are cross-sectional schematic views illustrating the manufacturing method example of the second structural example, and illustrate a Y-Z cross section. Here, a manufacturing process from formation of the field effect transistor 40 to formation of the insulating layer 63 will be described. The descriptions of the same portions as those of the manufacturing method example of the first structural example are omitted, and the description of the manufacturing method example of the first structure example is applicable as appropriate.

First, after the field effect transistor 40 is formed, the conductive oxide layer 51, the conductive layer 57, the conductive layer 52, and the insulating layer 53 are sequentially formed. The conductive layer 57 may be formed using, for example, sputtering and ALD.

In the case of the structure illustrated in FIG. 13, next, the insulating layer 53, the conductive layer 52, and the conductive layer 57 are processed to expose a part of the conductive oxide layer 51 as illustrated in FIG. 15. The processing may be performed by forming a mask on a part of the insulating layer 53 using, for example, a photolithography technique and partially removing exposed portions of the insulating layer 53, the conductive layer 52, and the conductive layer 57 by etching using the mask. Examples of the etching include dry etching, wet etching, and the like.

In the case of the structure illustrated in FIG. 14, the insulating layer 53 and the conductive layer 52 are processed to expose a part of the conductive layer 57 as illustrated in FIG. 16.

Thereafter, the protective film 54 is formed in the same process as in the manufacturing method example of the first structural example, and in the case of the structure illustrated in FIG. 13, the conductive oxide layer 51 is processed. In the case of the structure illustrated in FIG. 14, the conductive layer 57 and the conductive oxide layer 51 are processed. Thereafter, the protective film 55 is formed, and then the insulating layer 63 is formed. A known method may be used as a method for forming other components. The above is the description of the manufacturing method example of the second structural example.

Third Structural Example of Memory Cell Array

Figure 17:
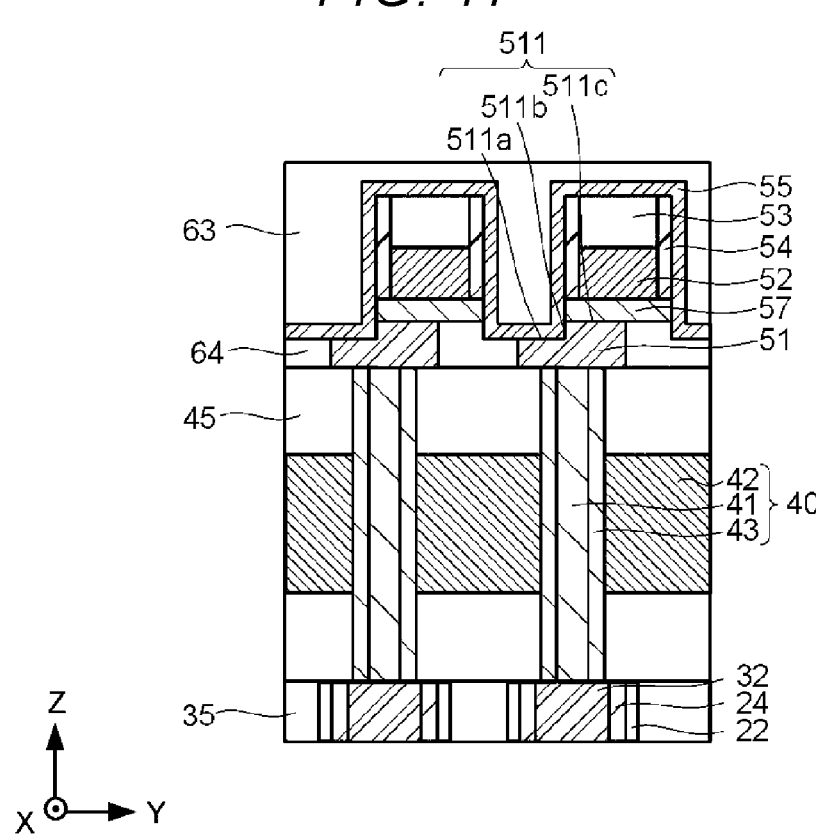
FIG. 17 is a cross-sectional schematic view illustrating a third structural example of the memory cell array.

FIG. 17 is a cross-sectional schematic view illustrating a third structural example of the memory cell array. For the same portions as those in FIG. 4, the description of FIG. 4 is applicable as appropriate. Hereinafter, portions different from those in FIG. 4 will be described.

An insulating layer 64 is provided on a part of the insulating layer 45. The insulating layer 64 is provided among a plurality of conductive oxide layers 51 in, for example, the Y-axis direction. The insulating layer 64 contains, for example, silicon and oxygen.

The conductive oxide layer 51 has an uneven surface (step surface) 511. At least a part of the uneven surface 511 is in contact with the protective film 55. The uneven surface 511 includes a surface 511a, a surface 511b, and a surface 511c. The surface 511a extends in the Y-axis direction and is in contact with the protective film 55. The surface 511b extends in the Z-axis direction from an end portion of the surface 511a and is in contact with the protective film 55. The surface 511c extends in the Y-axis direction from an end portion of the surface 511b and is in contact with the conductive layer 57.

The conductive layer 52 and the insulating layer 53 partially overlap the oxide semiconductor layer 41 when viewed from the Z-axis direction. As other descriptions of the conductive layer 52 and the insulating layer 53, the descriptions of the first structural example and the second structural example is applicable as appropriate.

The protective film 55 is in contact with the surface 511a and the surface 511b. As other descriptions of the protective film 55, the descriptions of the first structural example and the second structural example is applicable as appropriate.

The conductive layer 57 is provided between the conductive oxide layer 51 and the conductive layer 52. The conductive layer 57 contains, for example, titanium and nitrogen. By forming the conductive layer 57, it is possible to prevent diffusion of oxygen from the conductive oxide layer 51 to the conductive layer 52. As other descriptions of the conductive layer 57, the descriptions of the second structural example is applicable as appropriate.

As illustrated in FIG. 17, a surface area of the conductive oxide layer 51 can be increased by forming the uneven surface 511 on the conductive oxide layer 51. Therefore, in a process of supplying oxygen to the oxide semiconductor layer 41, the oxygen can be easily supplied to the oxide semiconductor layer 41 via the conductive oxide layer 51.

Next, a manufacturing method example of the third structural example will be described with reference to FIGS. 18 to 24. FIGS. 18 to 24 are cross-sectional schematic views illustrating the manufacturing method example of the third structural example, and illustrate a Y-Z cross section. Here, a manufacturing process from formation of the field effect transistor 40 to formation of the insulating layer 63 will be described. The descriptions of the same portions as those of the manufacturing method example of the first structural example or the second structural example are omitted, and the descriptions of these manufacturing method examples is applicable as appropriate.

Figure 18:
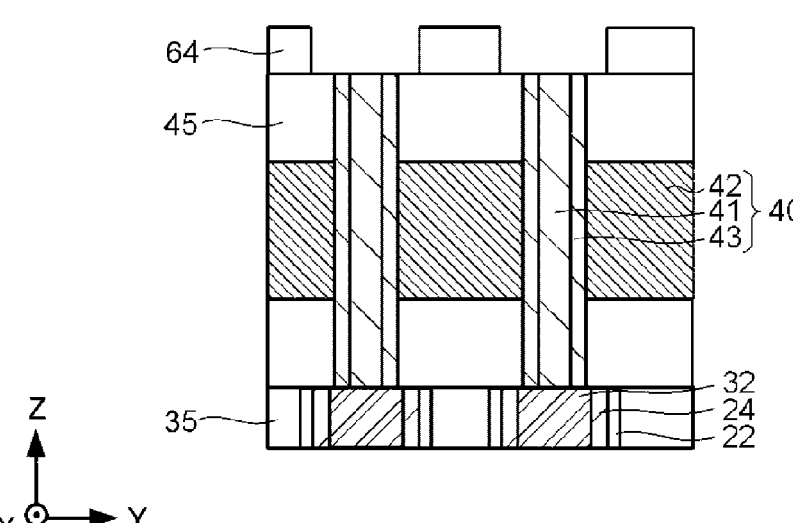
FIG. 18 is a cross-sectional schematic view illustrating a manufacturing method example of the third structural example.

After the field effect transistor 40 is formed, the insulating layer 64 that covers the insulating layer 45 and the field effect transistor 40 is formed, and the insulating layer 64 is partially removed, so that an upper surface of the oxide semiconductor layer 41 and an upper surface of the insulating layer 43 are exposed as illustrated in FIG. 18. The insulating layer 64 may be formed using, for example, CVD. Further, the insulating layer 64 may be processed by forming a mask on a part of the insulating layer 64 using, for example, a photolithography technique and partially removing an exposed portion of the insulating layer 64 by etching using the mask. Examples of the etching include dry etching, wet etching, and the like.

Figure 19:
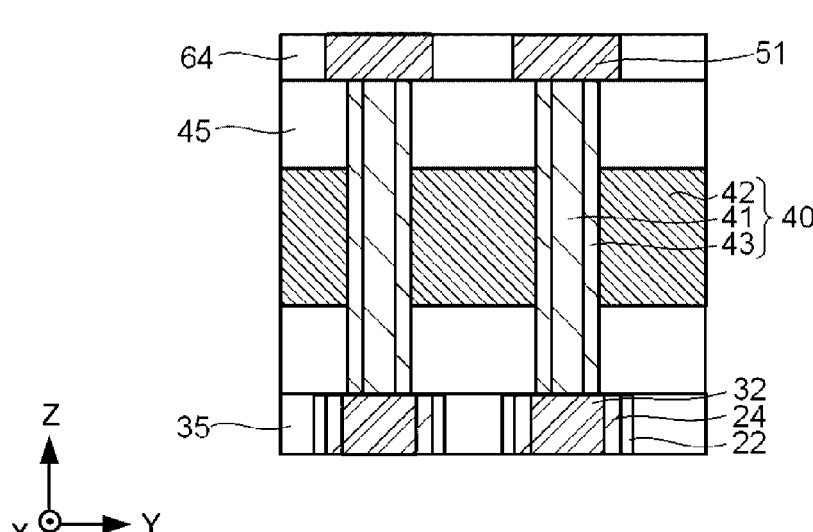
FIG. 19 is a cross-sectional schematic view illustrating the manufacturing method example of the third structural example.

Next, the conductive oxide layer 51 is formed to cover the upper surface of the insulating layer 64, the upper surface of the oxide semiconductor layer 41, and an upper surface of the insulating layer 43. A part of the conductive oxide layer 51 is removed in a thickness direction, so that the upper surface of the insulating layer 64 is exposed as illustrated in FIG. 19. The conductive oxide layer 51 may be partially removed by, for example, reactive ion etching or CMP.

Figure 20:
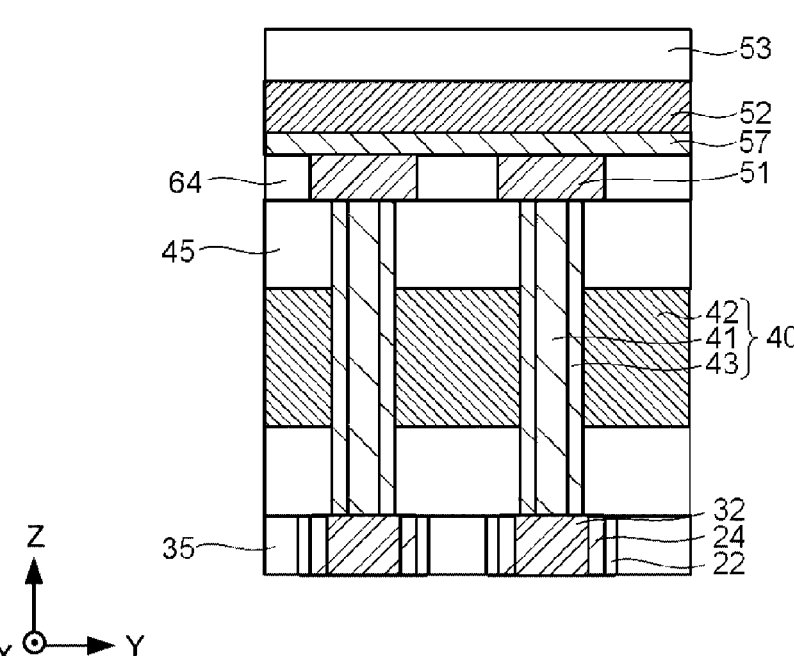
FIG. 20 is a cross-sectional schematic view illustrating the manufacturing method example of the third structural example.

Next, as illustrated in FIG. 20, the conductive layer 57, the conductive layer 52, and the insulating layer 53 are sequentially formed on the insulating layer 64 and the conductive oxide layer 51. The conductive layer 57, the conductive layer 52, and the insulating layer 53 may be formed by the same method as the manufacturing method example of the second structural example.

Figures 21, 22:
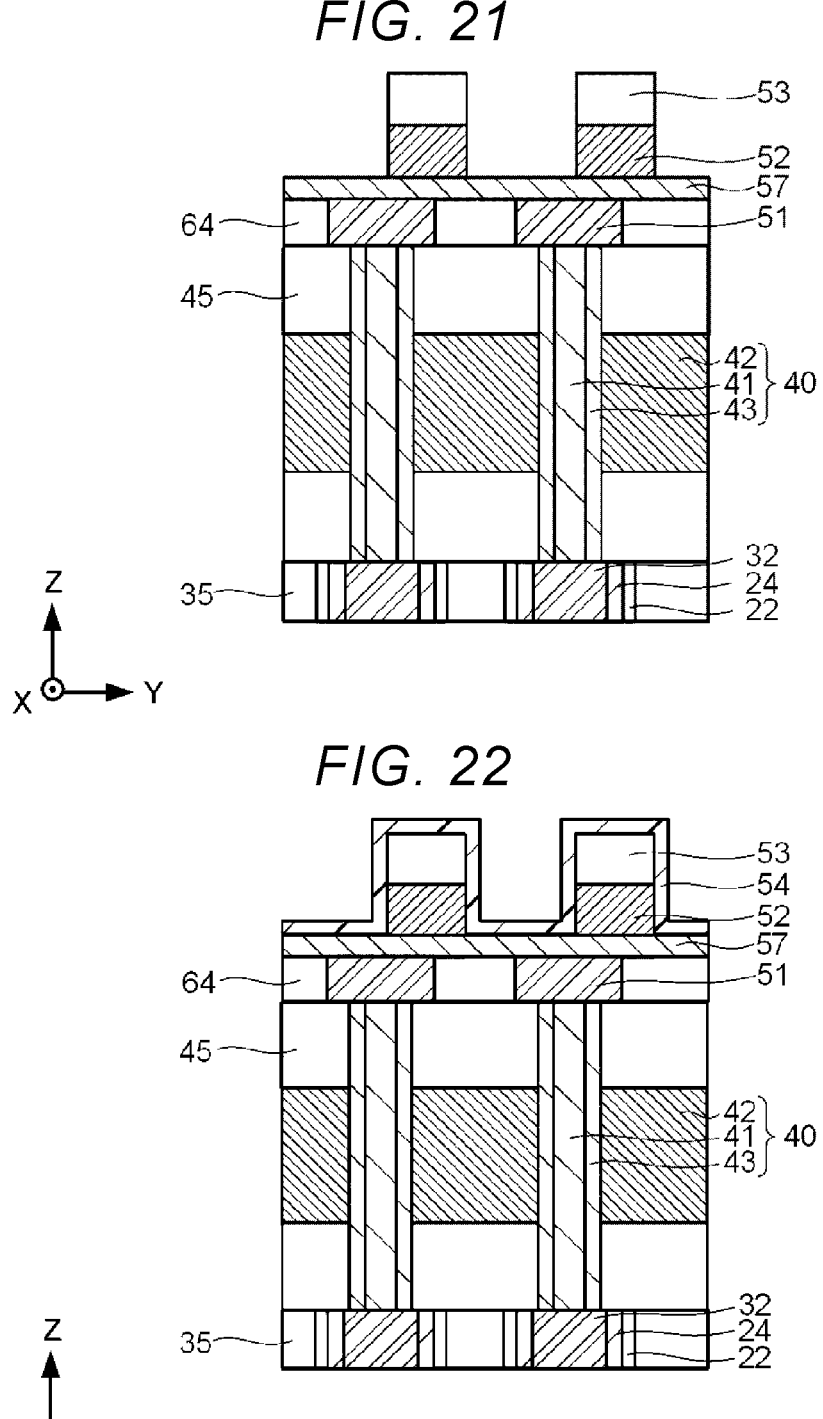
FIG. 21 is a cross-sectional schematic view illustrating the manufacturing method example of the third structural example.
FIG. 22 is a cross-sectional schematic view illustrating the manufacturing method example of the third structural example.

Next, the insulating layer 53 is processed to expose a part of the conductive layer 52, and an exposed portion of the conductive layer 52 is removed by etching using the insulating layer 53 as a mask, so that a part of the conductive layer 57 is exposed as illustrated in FIG. 21. The conductive layer 52 and the insulating layer 53 may be processed by the same method as the manufacturing method example of the first structural example.

Next, as illustrated in FIG. 22, the protective film 54 that covers the conductive layer 52, the insulating layer 53, and the conductive layer 57 is formed. The protective film 54 may be formed by the same method as, for example, the manufacturing method examples of the first structural example and the second structural example.

Figure 23:
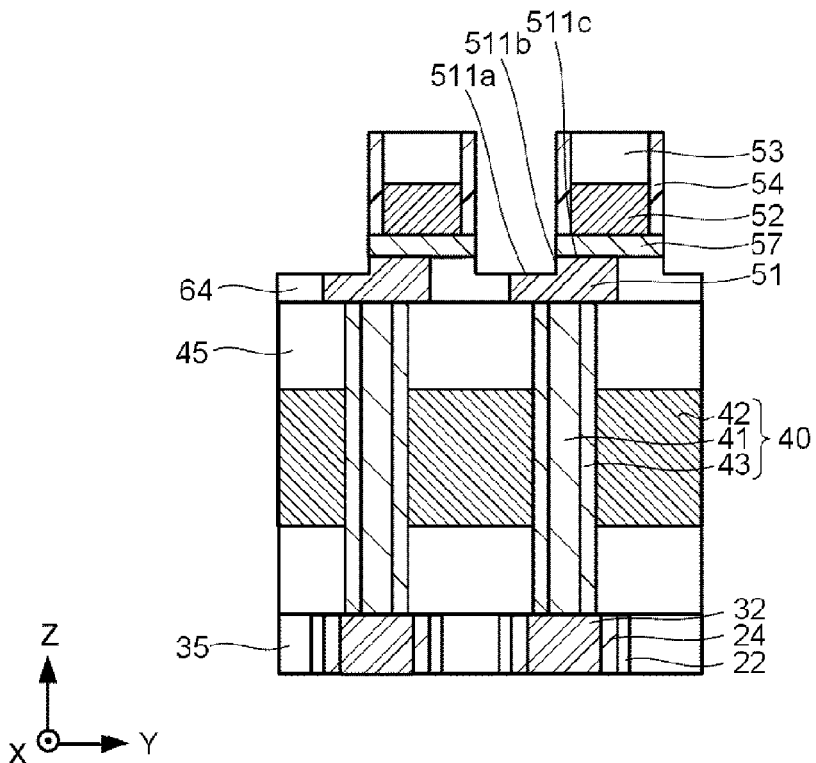
FIG. 23 is a cross-sectional schematic view illustrating the manufacturing method example of the third structural example.

Next, by removing a part of the protective film 54 in the thickness direction, a part of the conductive oxide layer 51 and a part of the insulating layer 64 are exposed while the other part of the protective film 54 in contact with the side surface of the conductive layer 52 and the side surface of the insulating layer 53 is remained. Then, as illustrated in FIG. 23, a part of an exposed portion of the conductive oxide layer 51 and a part of an exposed portion of the insulating layer 64 are removed, so that the surface 511a, the surface 511b, and the surface 511c are formed. The protective film 54 may be partially removed by, for example, reactive ion etching. The conductive oxide layer 51 and the insulating layer 64 may be partially removed by, for example, reactive ion etching, dry etching, or wet etching.

Thereafter, by performing a heat treatment in an oxidizing atmosphere, oxygen can be introduced into the oxide semiconductor layer 41 via the conductive oxide layer 51. The oxidizing atmosphere contains, for example, oxygen, ozone, or water vapor. Further, the heat treatment may be performed under a nitrogen atmosphere.

Figure 24:
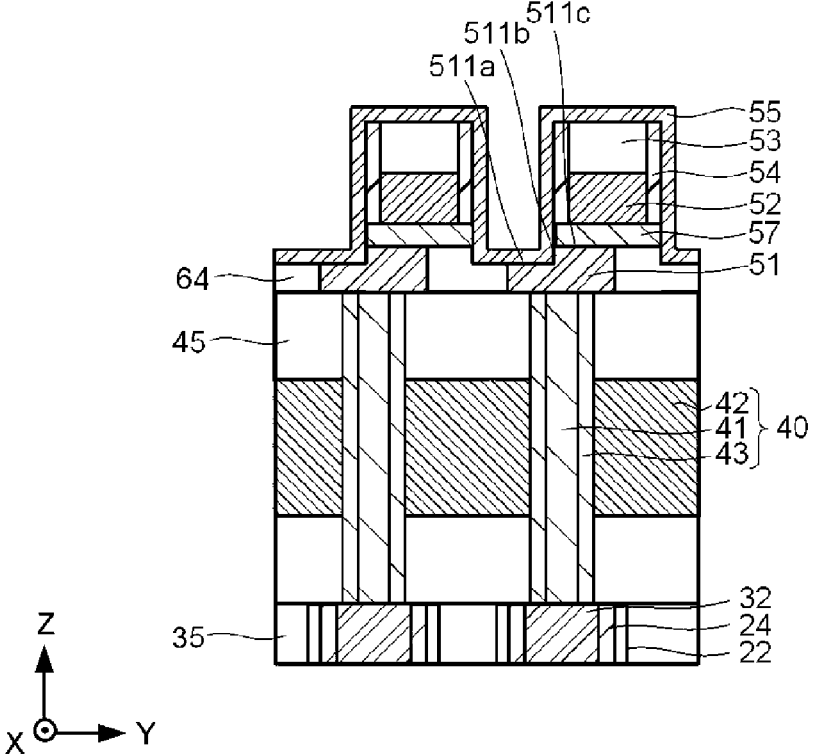
FIG. 24 is a cross-sectional schematic view illustrating the manufacturing method example of the third structural example.

Next, as illustrated in FIG. 24, the protective film 55 that covers the surface 511a and the surface 511b of the conductive oxide layer 51 is formed. By forming the protective film 55, it is possible to prevent oxygen from being released from the oxide semiconductor layer 41 via the conductive oxide layer 51 after the heat treatment. The protective film 55 may be formed using, for example, CVD.

Thereafter, the insulating layer 63 is formed. A known method may be used as a method for forming other components. The above is the description of the manufacturing method example of the third structural example.

Fourth Structural Example of Memory Cell Array

Figure 25:
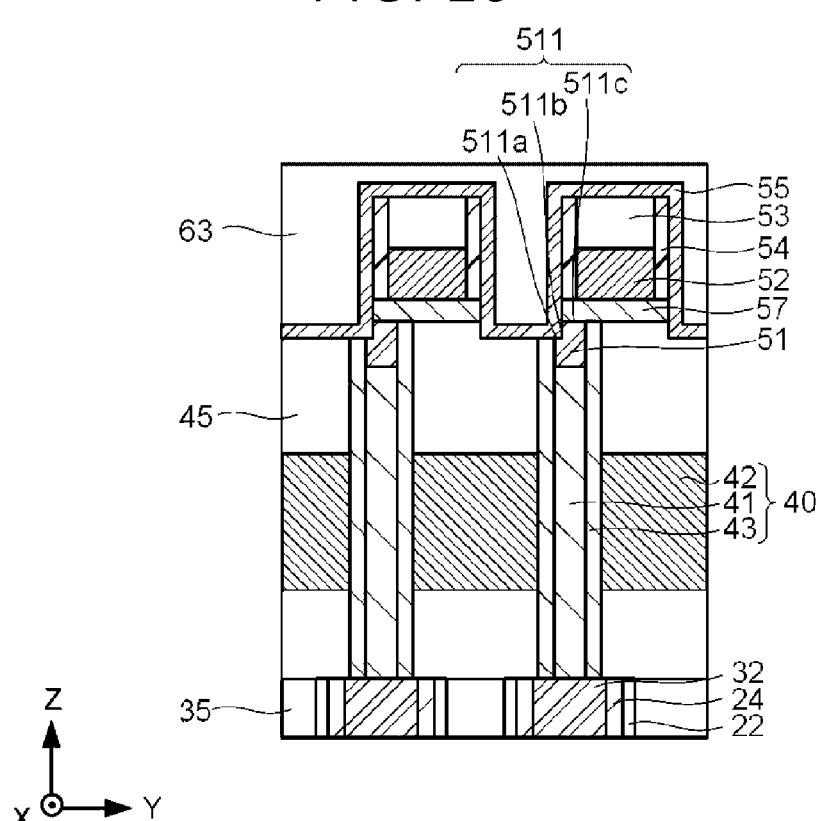
FIG. 25 is a cross-sectional schematic view illustrating a fourth structural example of the memory cell array.

FIG. 25 is a cross-sectional schematic view illustrating a fourth structural example of the memory cell array. For the same portions as those in FIG. 4, the description of FIG. 4 is applicable as appropriate. Hereinafter, portions different from those in FIG. 4 will be described.

At least a part of a side surface of the conductive oxide layer 51 is in contact with the insulating layer 43. The conductive oxide layer 51 includes the uneven surface 511. The uneven surface 511 includes a surface 511a, a surface 511b, and a surface 511c. The surface 511a extends in the Y-axis direction and is in contact with the protective film 55. The surface 511b extends in the Z-axis direction from an end portion of the surface 511a and is in contact with the protective film 55. The surface 511c extends in the Y-axis direction from an end portion of the surface 511b and is in contact with the conductive layer 57.

The conductive layer 52 and the insulating layer 53 are provided on a part of an upper surface of the conductive layer 57. The conductive layer 52 and the insulating layer 53 partially overlap the oxide semiconductor layer 41 when viewed from the Z-axis direction. As other descriptions of the conductive layer 52 and the insulating layer 53, the descriptions of the first structural example is applicable as appropriate.

The protective film 55 is in contact with the surface 511*a* and the surface 511*b*. As other descriptions of the protective film 55, the descriptions of the first structural example to the third structural example is applicable as appropriate.

The conductive layer 57 is provided between the conductive oxide layer 51 and the conductive layer 52. The conductive layer 57 contains, for example, titanium and nitrogen. By forming the conductive layer 57, it is possible to prevent diffusion of oxygen from the conductive oxide layer 51 to the conductive layer 52. As other descriptions of the conductive layer 57, the descriptions of the second structural example is applicable as appropriate.

As illustrated in FIG. 25, a surface area of the conductive oxide layer 51 can be increased by forming the uneven surface 511 on the conductive oxide layer 51. Therefore, in a process of supplying oxygen to the oxide semiconductor layer 41, the oxygen can be easily supplied to the oxide semiconductor layer 41 via the conductive oxide layer 51.

Next, a manufacturing method example of the fourth structural example will be described with reference to FIGS. 26 to 32. FIGS. 26 to 32 are cross-sectional schematic views illustrating the manufacturing method example of the fourth structural example, and illustrate a Y-Z cross section. Here, a manufacturing process from formation of the field effect transistor 40 to formation of the insulating layer 63 will be described. The descriptions of the same portions as those of the manufacturing method examples of the first structural example to the third structural example are omitted, and the descriptions of these manufacturing method examples is applicable as appropriate.

Figure 26:
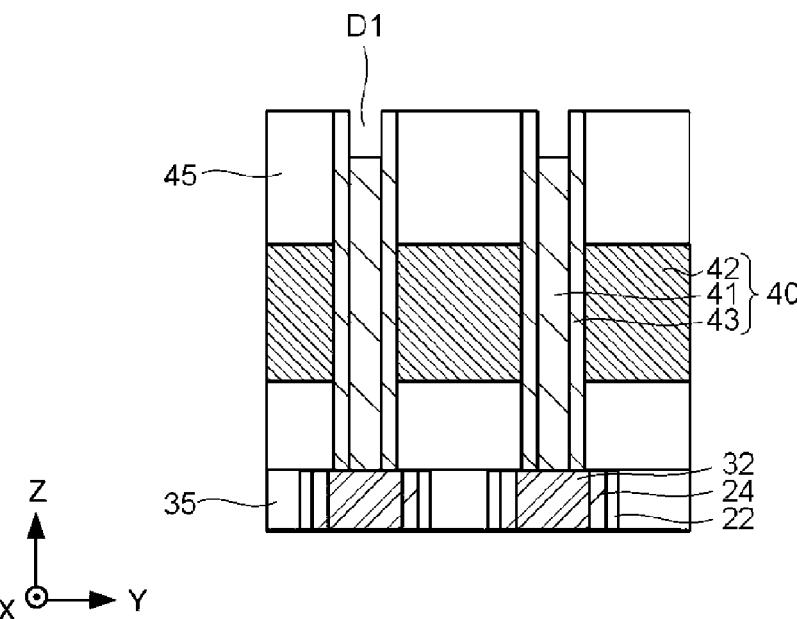
FIG. 26 is a cross-sectional schematic view illustrating a manufacturing method example of the fourth structural example.

As illustrated in FIG. 26, a recessed portion D1 is formed on the field effect transistor 40 and the oxide semiconductor layer 41, then, the conductive oxide layer 51 that covers the insulating layer 45, the insulating layer 43, and the recessed portion D1 is formed, and a part of the conductive oxide layer 51 is removed in a thickness direction, so that an upper surface of the insulating layer 45 is exposed as illustrated in FIG. 27. The recessed portion D1 can be formed by further removing a part of the oxide semiconductor layer 41 from the same height as the upper surface of the insulating layer 45 in the thickness direction when forming the oxide semiconductor layer 41 of the field effect transistor 40. The oxide semiconductor layer 41 may be partially removed by, for example, reactive ion etching or CMP.

Next, as illustrated in FIG. 28, the conductive layer 57, the conductive layer 52, and the insulating layer 53 are sequentially formed on the insulating layer 45, the insulating layer 43, and the conductive oxide layer 51. The conductive layer 57, the conductive layer 52, and the insulating layer 53 may be formed by the same method as the manufacturing method example of the second structural example.

Figures 29, 30:
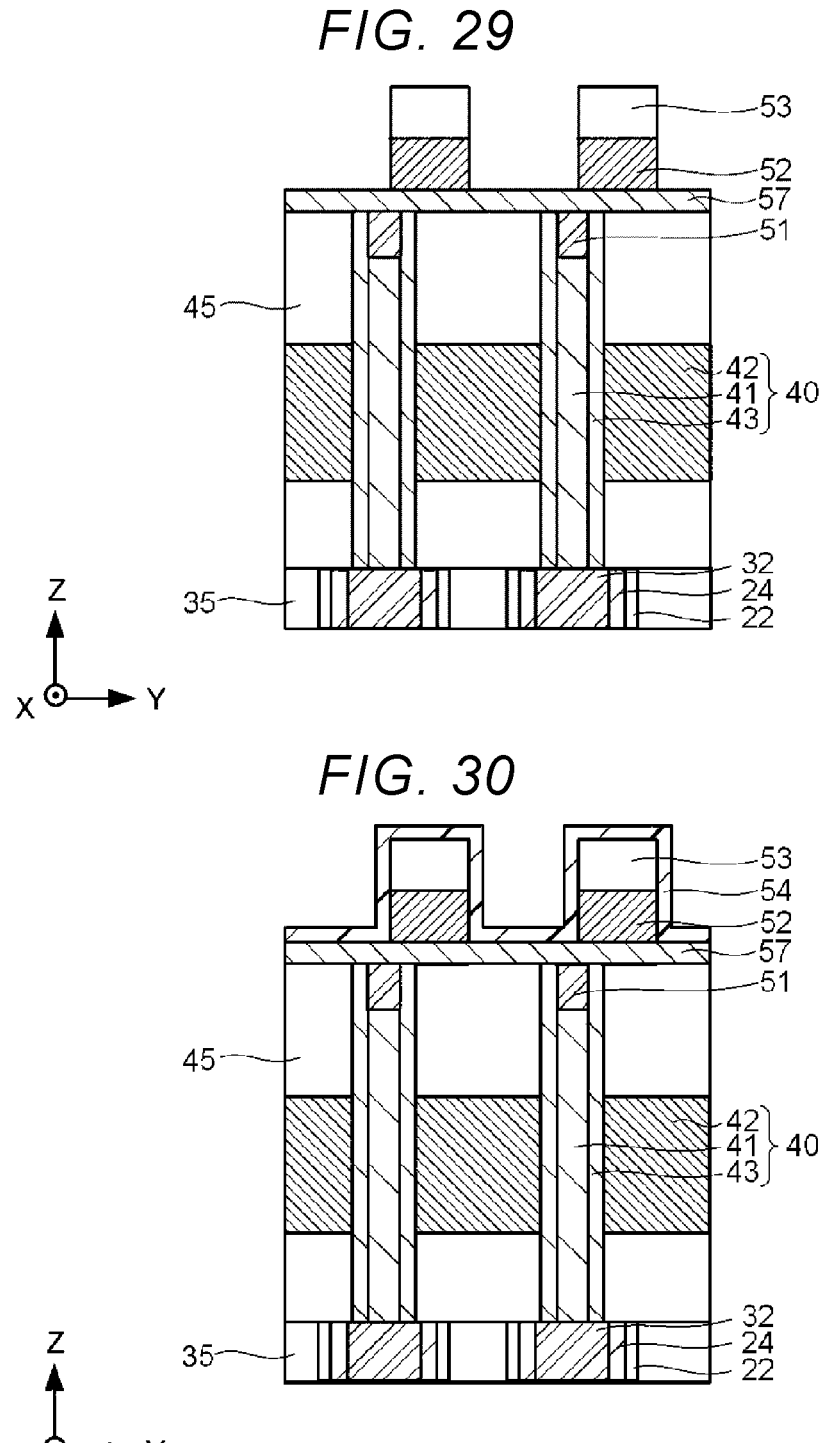
FIG. 29 is a cross-sectional schematic view illustrating the manufacturing method example of the fourth structural example.
FIG. 30 is a cross-sectional schematic view illustrating the manufacturing method example of the fourth structural example.

Next, the insulating layer 53 is processed to expose a part of the conductive layer 52, and an exposed portion of the conductive layer 52 is removed by etching using the insulating layer 53 as a mask, so that a part of the conductive layer 57 is exposed as illustrated in FIG. 29. The conductive layer 52 and the insulating layer 53 may be processed by the same method as the manufacturing method example of the first structural example.

Next, as illustrated in FIG. 30, the protective film 54 that covers the conductive layer 52, the insulating layer 53, and the conductive layer 57 is formed. The protective film 54 may be formed by the same method as, for example, the manufacturing method examples of the first structural example to the third structural example.

Figure 31:
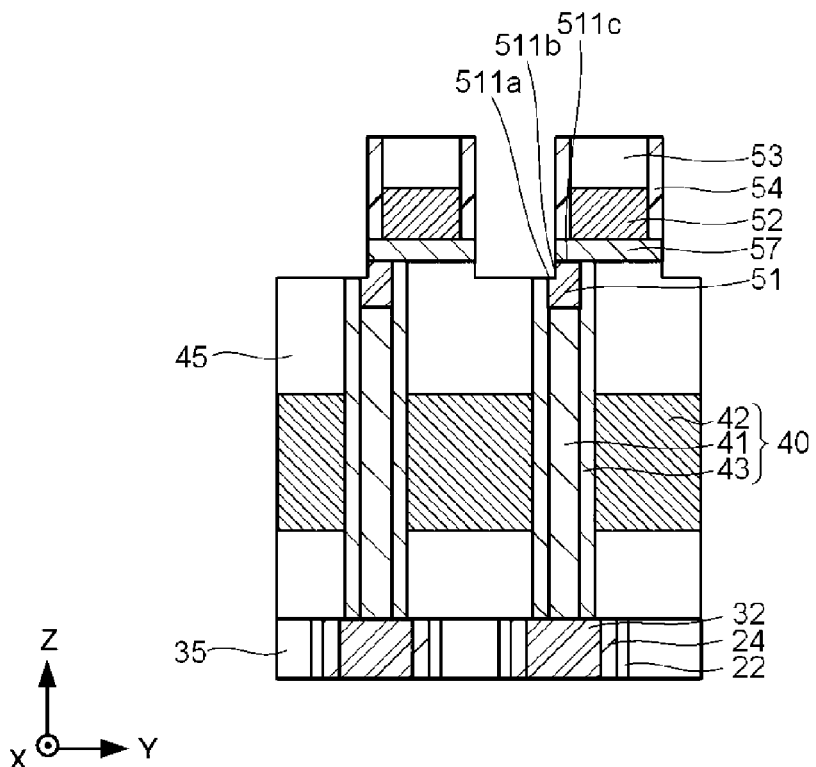
FIG. 31 is a cross-sectional schematic view illustrating the manufacturing method example of the fourth structural example.

Next, as illustrated in FIG. 31, by removing a part of the protective film 54 in a thickness direction, the other part of the protective film 54 in contact with a side surface of the conductive layer 52 and a side surface of the insulating layer 53 is remained. Thereafter, a part of the conductive layer 57 is removed to expose a part of the conductive oxide layer 51 and a part of the insulating layer 45. Further, the surface 511*a*, the surface 511*b*, and the surface 511*c* are formed by removing a part of an exposed portion of the conductive oxide layer 51 and a part of an exposed portion of the insulating layer 45. The protective film 54 may be partially removed by, for example, reactive ion etching. The conductive oxide layer 51 and the insulating layer 45 may be partially removed by, for example, reactive ion etching, dry etching, or wet etching.

Thereafter, by performing a heat treatment in an oxidizing atmosphere, oxygen can be introduced into the oxide semiconductor layer 41 via the conductive oxide layer 51. The oxidizing atmosphere contains, for example, oxygen, ozone, or water vapor. Further, the heat treatment may be performed under a nitrogen atmosphere.

Figure 32:
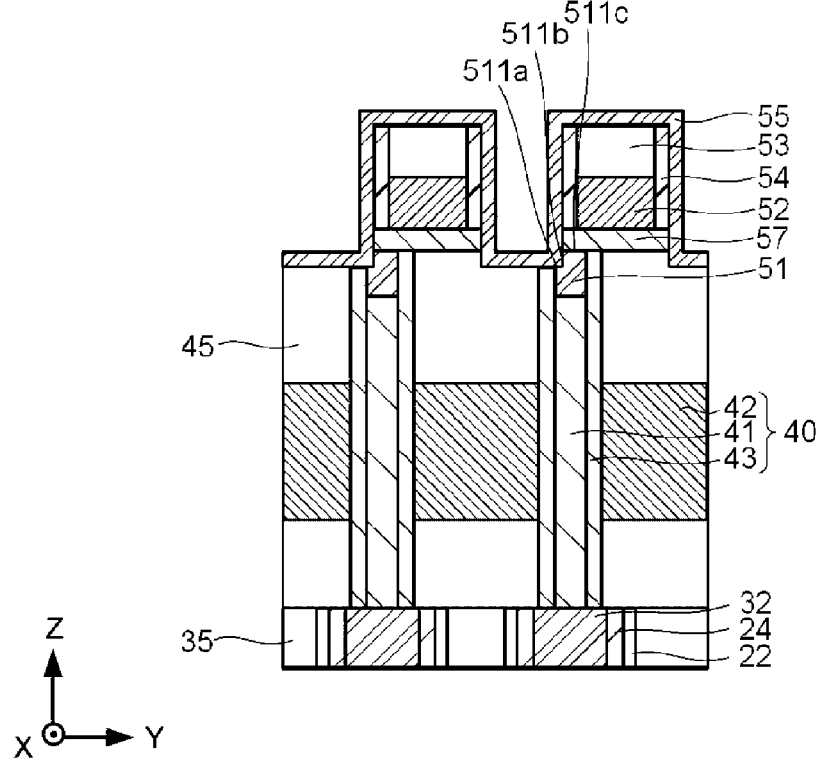
FIG. 32 is a cross-sectional schematic view illustrating the manufacturing method example of the fourth structural example.

Next, as illustrated in FIG. 32, the protective film 55 that covers the surface 511*a* and the surface 511*b* of the conductive oxide layer 51 is formed. By forming the protective film 55, it is possible to prevent oxygen from being released from the oxide semiconductor layer 41 via the conductive oxide layer 51 after the heat treatment. The protective film 55 may be formed using, for example, CVD.

Thereafter, the insulating layer 63 is formed. A known method may be used as a method for forming other components. The above is the description of the manufacturing method example of the fourth structural example.

Fifth Structural Example of Memory Cell Array

Figure 33:
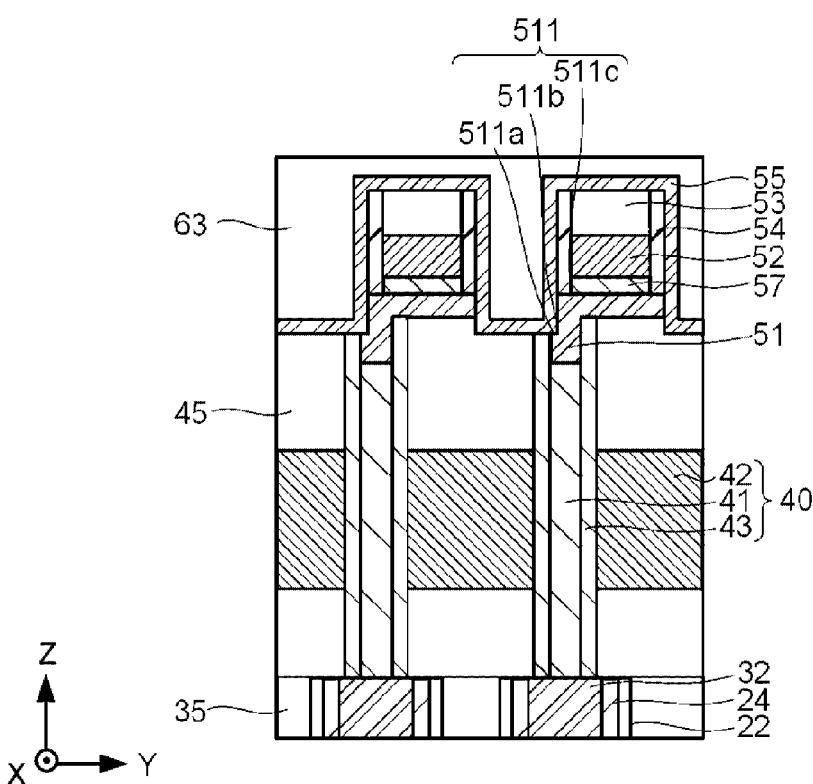
FIG. 33 is a cross-sectional schematic view illustrating a fifth structural example of the memory cell array.

FIG. 33 is a cross-sectional schematic view illustrating a fifth structural example of the memory cell array. For the same portions as those in FIG. 4, the description of FIG. 4 is applicable as appropriate. Hereinafter, portions different from those in FIG. 4 will be described.

At least a part of a side surface of the conductive oxide layer 51 is in contact with the insulating layer 43. The conductive oxide layer 51 includes the uneven surface 511. The uneven surface 511 includes a surface 511*a*, a surface 511*b*, and a surface 511*c*. The surface 511*a* extends in the Y-axis direction and is in contact with the protective film 55. The surface 511*b* extends in the Z-axis direction from an end portion of the surface 511*a* and is in contact with the protective film 55. The surface 511*c* extends in the Y-axis direction from an end portion of the surface 511*b* and is in contact with the protective film 54 and the conductive layer 57.

The conductive layer 52 and the insulating layer 53 are provided on a part of the upper surface of the conductive layer 57. The conductive layer 52 and the insulating layer 53 partially overlap the oxide semiconductor layer 41 when viewed from the Z-axis direction. As other descriptions of the conductive layer 52 and the insulating layer 53, the descriptions of the first structural example is applicable as appropriate.

The protective film 55 is in contact with the surface 511*a* and the surface 511*b*. As other descriptions of the protective film 55, the descriptions of the first structural example to the fourth structural example is applicable as appropriate.

The conductive layer 57 is provided between the conductive oxide layer 51 and the conductive layer 52. The conductive layer 57 contains, for example, titanium and nitrogen. By forming the conductive layer 57, it is possible to prevent diffusion of oxygen from the conductive oxide layer 51 to the conductive layer 52. As other descriptions of the conductive layer 57, the descriptions of the second structural example is applicable as appropriate.

As illustrated in FIG. 33, the uneven surface 511 is formed on the conductive oxide layer 51, and the conductive oxide layer 51 is extended to be in contact with the insulating layer 43 and the protective film 54, so that a surface area of the conductive oxide layer 51 can be increased. Therefore, in a process of supplying oxygen to the oxide semiconductor layer 41, the oxygen can be easily supplied to the oxide semiconductor layer 41 via the conductive oxide layer 51.

Next, a manufacturing method example of the fifth structural example will be described with reference to FIGS. 34 to 40. FIGS. 34 to 40 are cross-sectional schematic views illustrating the manufacturing method example of the fifth structural example, and illustrate a Y-Z cross section. Here, a manufacturing process from formation of the field effect transistor 40 to formation of the insulating layer 63 will be described. The descriptions of the same portions as those of the manufacturing method examples of the first structural example to the fourth structural example are omitted, and the descriptions of these manufacturing method examples is applicable as appropriate.

Figure 34:
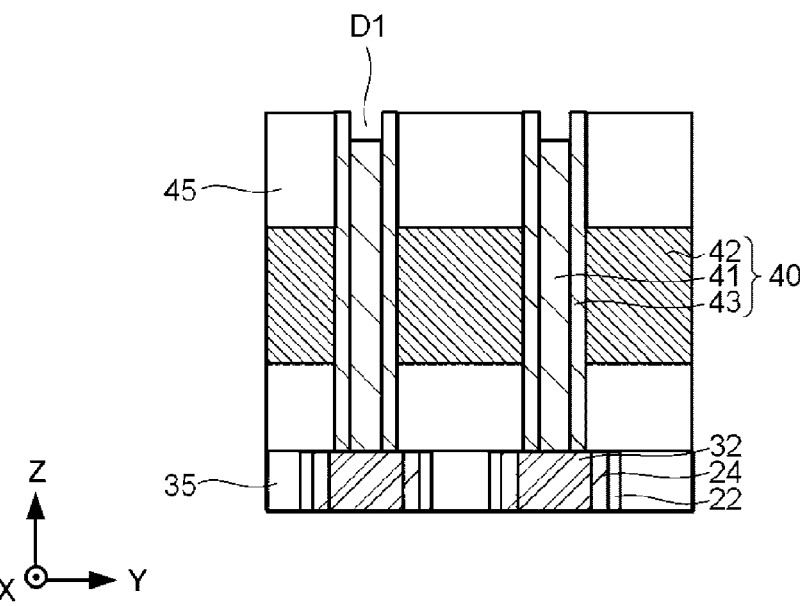
FIG. 34 is a cross-sectional schematic view illustrating a manufacturing method example of the fifth structural example.
Figure 35:
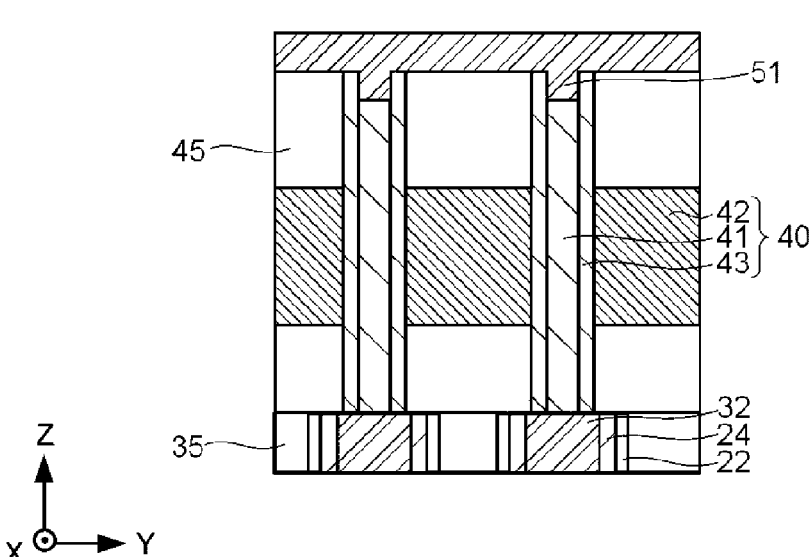
FIG. 35 is a cross-sectional schematic view illustrating the manufacturing method example of the fifth structural example.

As illustrated in FIG. 34, the recessed portion D1 is formed on the field effect transistor 40 and the oxide semiconductor layer 41, and then, the conductive oxide layer 51 that covers the insulating layer 45, the insulating layer 43, and the recessed portion D1 is formed as illustrated in FIG. 35. The recessed portion D1 can be formed by further removing a part of the oxide semiconductor layer 41 from the same height as the upper surface of the insulating layer 45 in the thickness direction when forming the oxide semiconductor layer 41 of the field effect transistor 40. The oxide semiconductor layer 41 may be partially removed by, for example, reactive ion etching or CMP.

Figure 36:
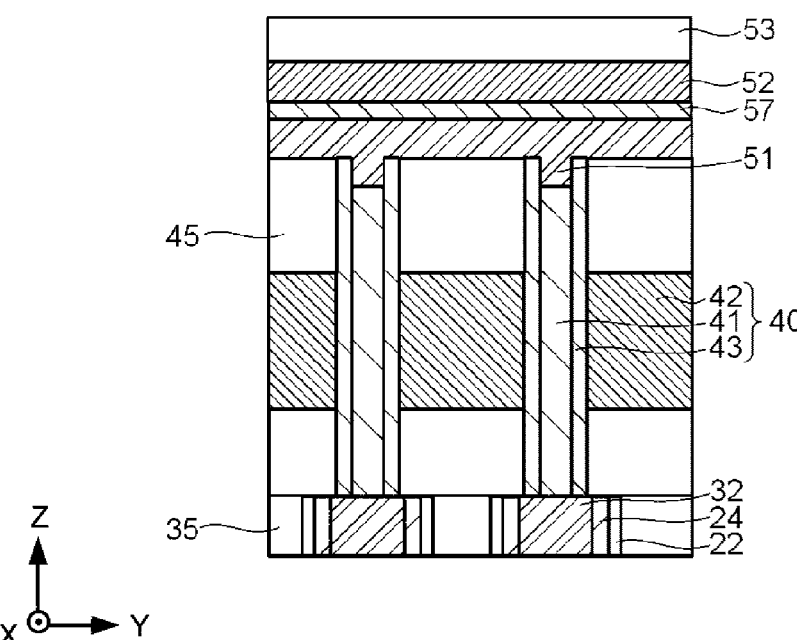
FIG. 36 is a cross-sectional schematic view illustrating the manufacturing method example of the fifth structural example.

Next, as illustrated in FIG. 36, the conductive layer 57, the conductive layer 52, and the insulating layer 53 are sequentially formed on the conductive oxide layer 51. The conductive layer 57, the conductive layer 52, and the insulating layer 53 may be formed by the same method as the manufacturing method example of the second structural example.

Figure 37:
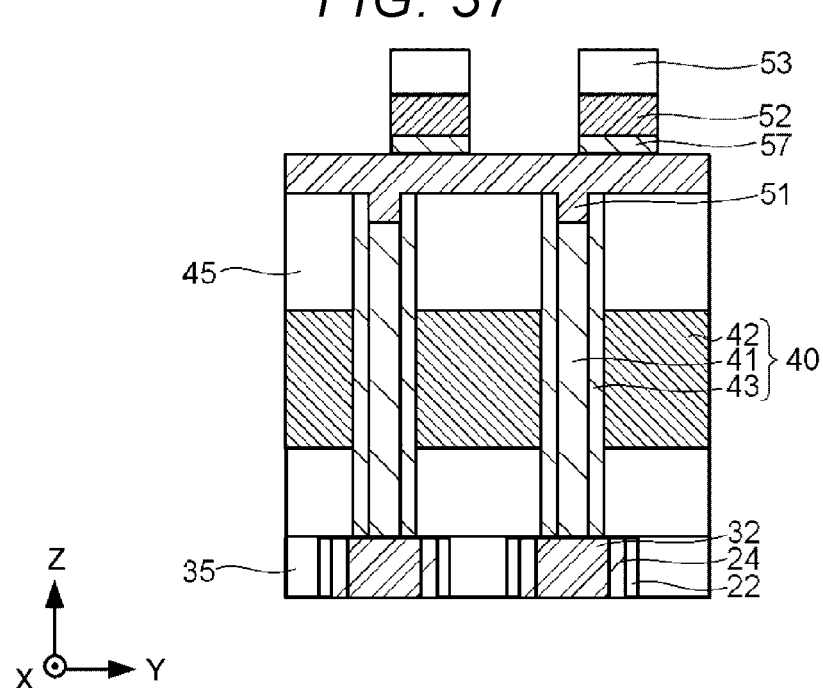
FIG. 37 is a cross-sectional schematic view illustrating the manufacturing method example of the fifth structural example.

Next, the insulating layer 53 is processed to expose a part of the conductive layer 52, and exposed portions of the conductive layer 52 and the conductive layer 57 are removed by etching using the insulating layer 53 as a mask, so that a part of the conductive oxide layer 51 is exposed as illustrated in FIG. 37. The conductive layer 52 and the insulating layer 53 may be processed by the same method as the manufacturing method example of the first structural example.

Figure 38:
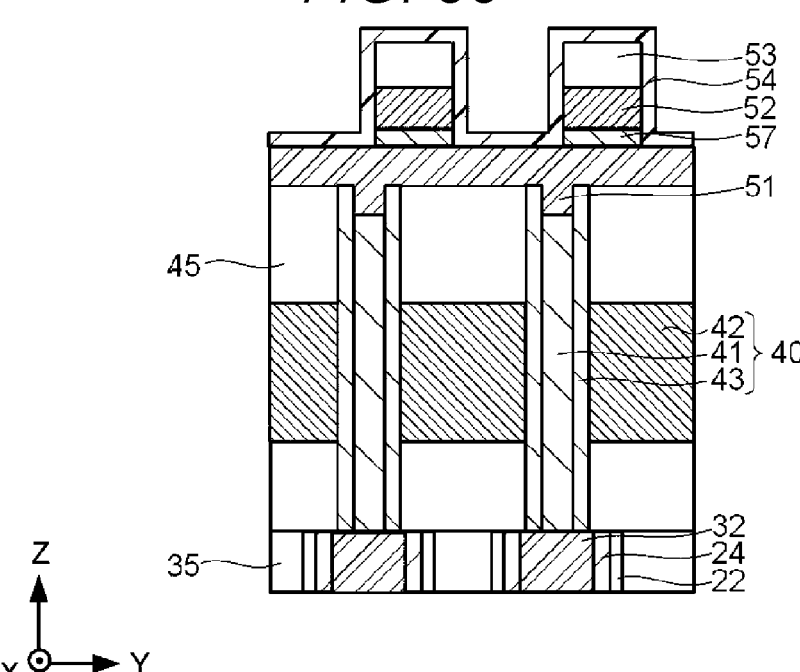
FIG. 38 is a cross-sectional schematic view illustrating the manufacturing method example of the fifth structural example.

Next, as illustrated in FIG. 38, the protective film 54 that covers the conductive oxide layer 51, the conductive layer 52, the insulating layer 53, and the conductive layer 57 is formed. The protective film 54 may be processed by the same method as, for example, the manufacturing method examples of the first structural example to the fourth structural example.

Figure 39:
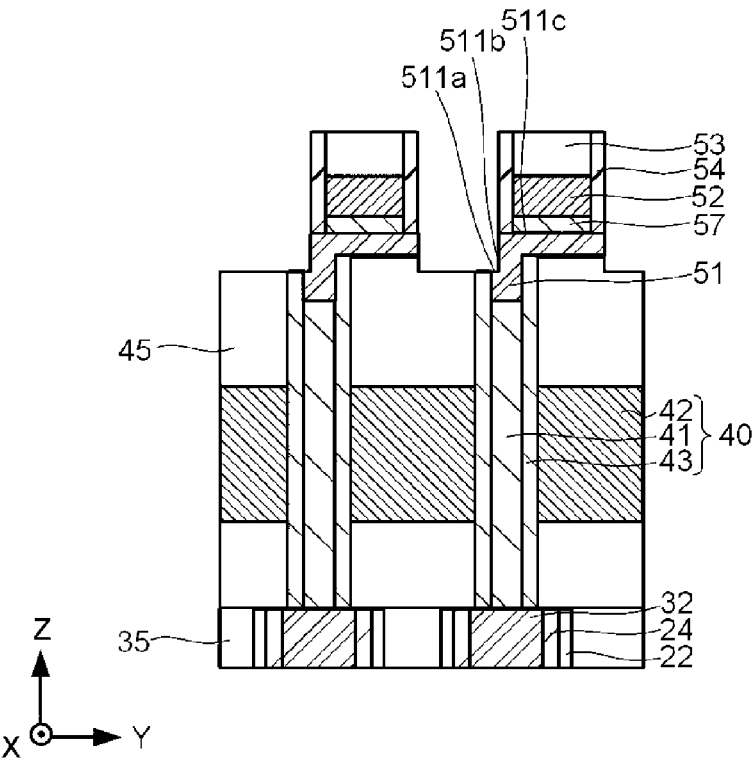
FIG. 39 is a cross-sectional schematic view illustrating the manufacturing method example of the fifth structural example.

Next, as illustrated in FIG. 39, by removing a part of the protective film 54 in a thickness direction, a part of the conductive oxide layer 51 is exposed while the other part of the protective film 54 in contact with the respective side surfaces of the conductive layer 52, the insulating layer 53, and the conductive layer 57 remain. Thereafter, a part of the conductive oxide layer 51 is removed to expose a part of the insulating layer 45. Further, the surface 511a, the surface 511b, and the surface 511c are formed by removing a part of an exposed portion of the conductive oxide layer 51 and a part of an exposed portion of the insulating layer 45. The protective film 54 may be partially removed by, for example, reactive ion etching. The conductive oxide layer 51 and the insulating layer 45 may be partially removed by, for example, reactive ion etching, dry etching, or wet etching.

Thereafter, by performing a heat treatment in an oxidizing atmosphere, oxygen can be introduced into the oxide semiconductor layer 41 via the conductive oxide layer 51. The oxidizing atmosphere contains, for example, oxygen, ozone, or water vapor. Further, the heat treatment may be performed under a nitrogen atmosphere.

Figure 40:
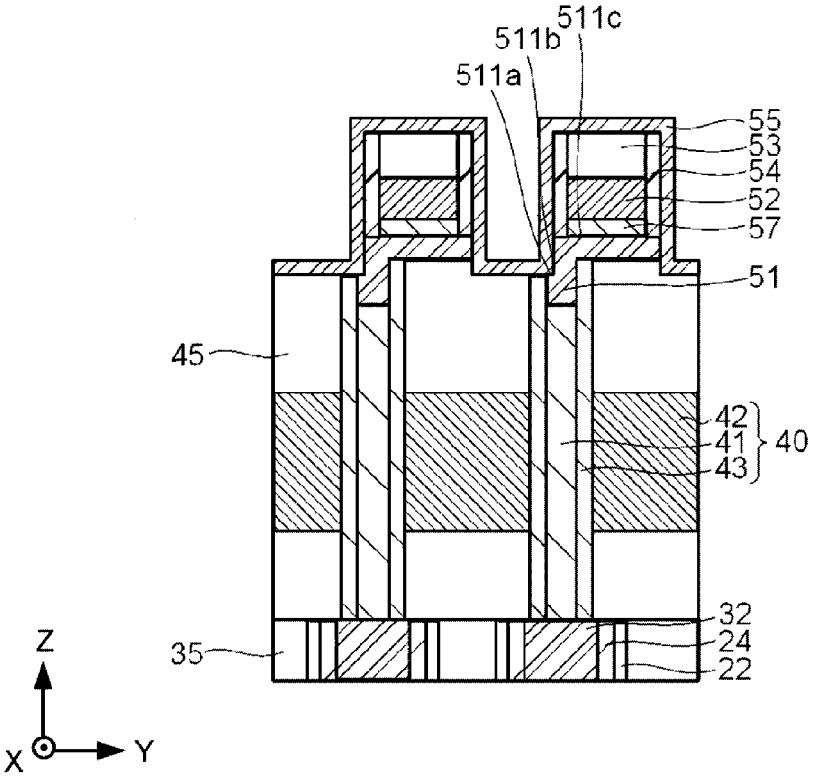
FIG. 40 is a cross-sectional schematic view illustrating the manufacturing method example of the fifth structural example.

Next, as illustrated in FIG. 40, the protective film 55 that covers the surface 511a and the surface 511b of the conductive oxide layer 51 is formed. By forming the protective film 55, it is possible to prevent oxygen from being released from the oxide semiconductor layer 41. The protective film 55 may be formed by the same method as, for example, the manufacturing method examples of the first structural example to the fourth structural example.

Thereafter, the insulating layer 63 is formed. A known method may be used as a method for forming other components. The above is the description of the manufacturing method example of the fifth structural example.

Sixth Structural Example of Memory Cell Array

Figures 41, 42:
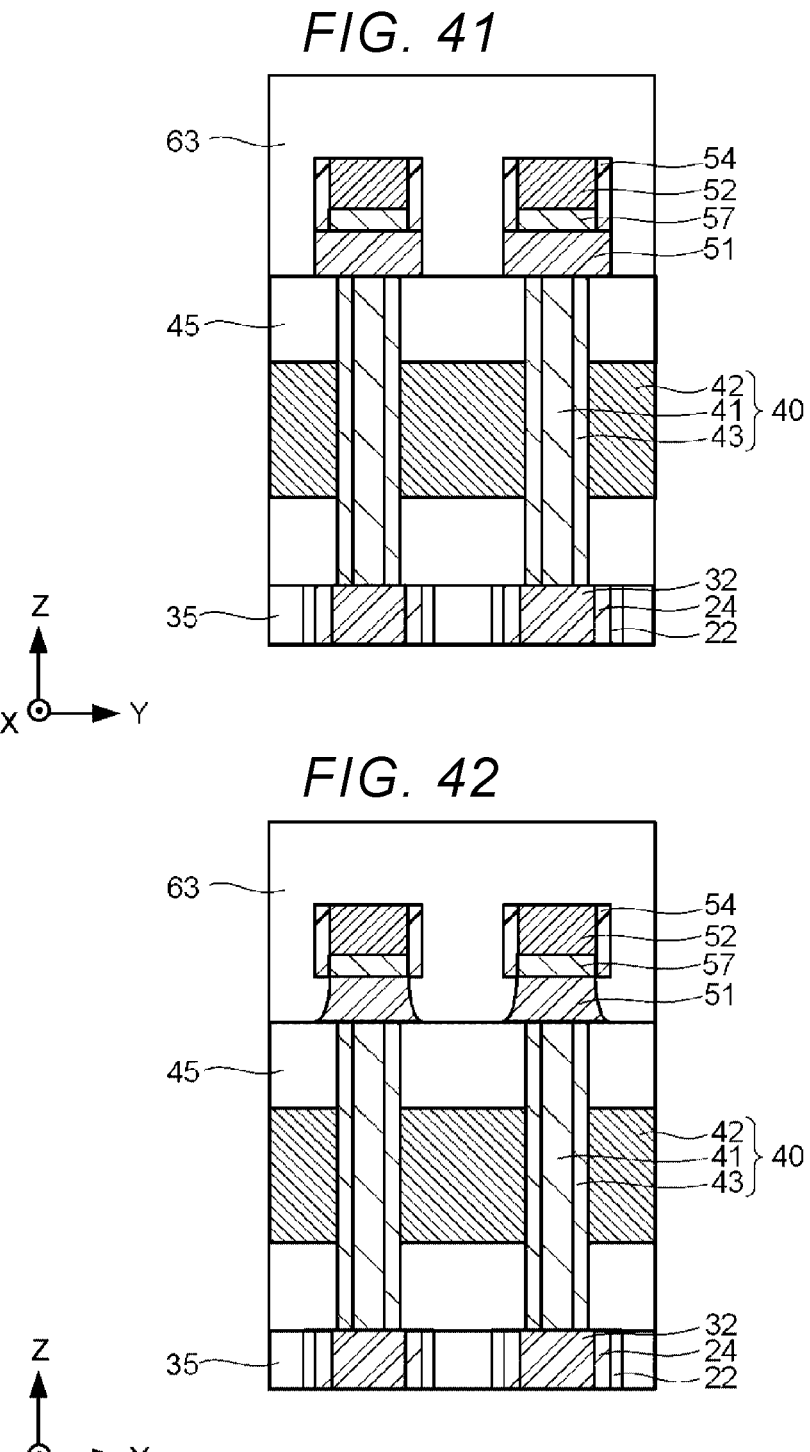
FIG. 41 is a cross-sectional schematic view illustrating a sixth structural example of the memory cell array.
FIG. 42 is a cross-sectional schematic view illustrating the sixth structural example of the memory cell array.

FIGS. 41 and 42 are cross-sectional schematic views illustrating a sixth structural example of the memory cell array. The sixth structural example of the memory cell array does not include the insulating layer 53 and the protective film 55 illustrated in FIG. 4, while further includes the conductive layer 57. For the same portions as those in FIG. 4, the description of FIG. 4 is applicable as appropriate. Hereinafter, portions different from those in FIG. 4 will be described.

The side surface of the conductive oxide layer 51 is in contact with the insulating layer 63. An upper surface of the conductive oxide layer 51 is in contact with the conductive layer 57 and the protective film 54. As illustrated in FIG. 42, the upper surface of the conductive oxide layer 51 may not be in contact with the protective film 54. As other descriptions of the conductive oxide layer 51, the descriptions of the first structural example is applicable as appropriate.

An upper surface of the conductive layer 52 is in contact with the insulating layer 63, and the side surface of the conductive layer 52 is in contact with the protective film 54. As other descriptions of the conductive layer 52, the descriptions of the first structural example is applicable as appropriate.

The conductive layer 57 is provided between the conductive oxide layer 51 and the conductive layer 52. The side surface of the conductive layer 57 is in contact with the protective film 54. By forming the protective film 54, it is possible to prevent oxidation of the conductive layer 52 and oxidation of the conductive layer 57 when oxygen is introduced into the oxide semiconductor layer 41. The conductive layer 57 contains, for example, titanium and nitrogen. By forming the conductive layer 57, it is possible to prevent diffusion of oxygen from the conductive oxide layer 51 to the conductive layer 52.

Next, a manufacturing method example of the sixth structural example will be described with reference to FIGS. 43 to 46. FIGS. 43 to 46 are cross-sectional schematic views illustrating the manufacturing method example of the sixth structural example, and illustrate a Y-Z cross section. Here, a manufacturing process from formation of the field effect transistor 40 to formation of the insulating layer 63 will be described. The descriptions of the same portions as those of the manufacturing method examples of the first structural example to the fifth structural example are omitted, and the descriptions of the manufacturing method examples of the first structural example to the fifth structural example is applicable as appropriate.

First, after the field effect transistor 40 is formed, the conductive oxide layer 51, the conductive layer 57, and the conductive layer 52 are sequentially formed. The conductive layer 57 may be formed using, for example, sputtering and ALD.

Figure 43:
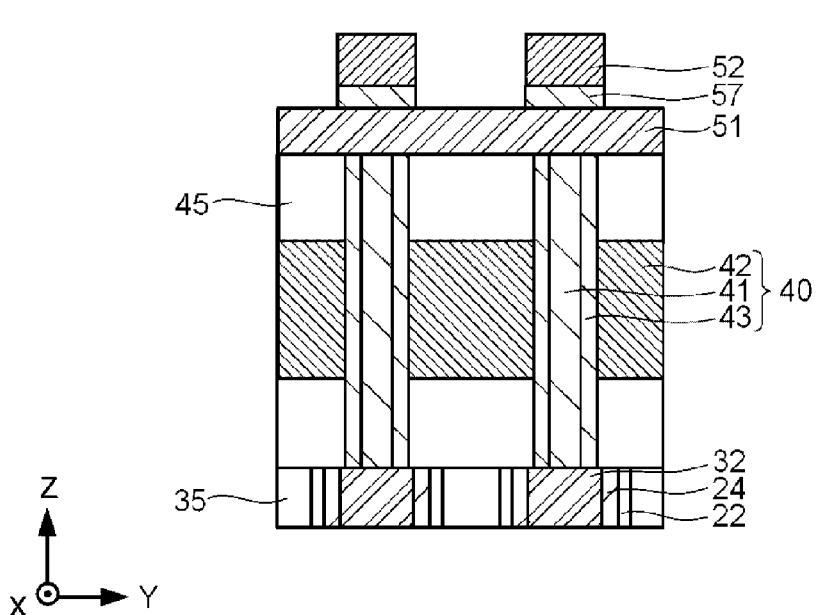
FIG. 43 is a cross-sectional schematic view illustrating a manufacturing method example of the sixth structural example.

Next, as illustrated in FIG. 43, the conductive layer 57 and the conductive layer 52 are processed to expose a part of the conductive oxide layer 51. The processing may be performed by forming a mask on the conductive layer 52 using, for example, a photolithography technique and partially removing the conductive layer 52 and the conductive layer 57 by etching using the mask. Examples of the etching include dry etching, wet etching, and the like.

Figure 44:
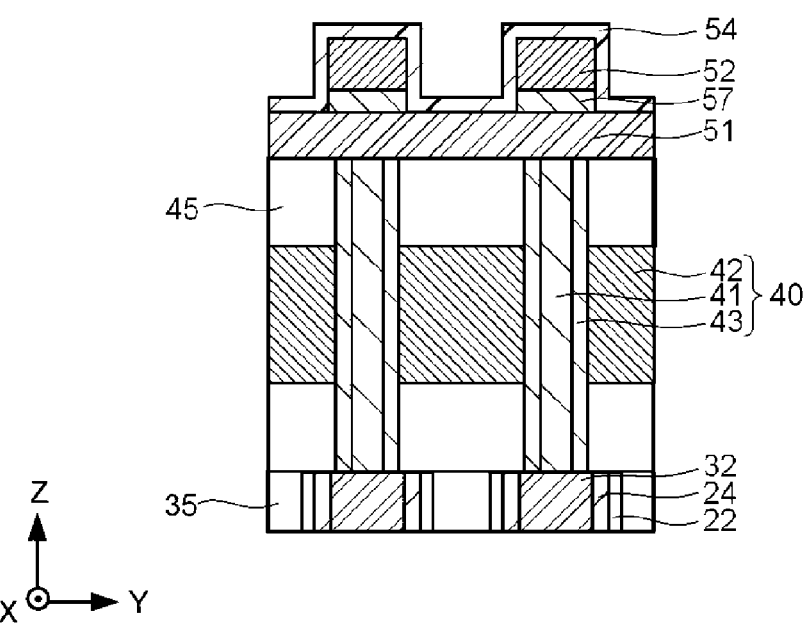
FIG. 44 is a cross-sectional schematic view illustrating the manufacturing method example of the sixth structural example.

Next, as illustrated in FIG. 44, the protective film 54 that covers the conductive oxide layer 51, the conductive layer 52, and the conductive layer 57 is formed. The protective film 54 may be formed by the same method as, for example, the manufacturing method examples of the first structural example to the fifth structural example.

Figures 45, 46:
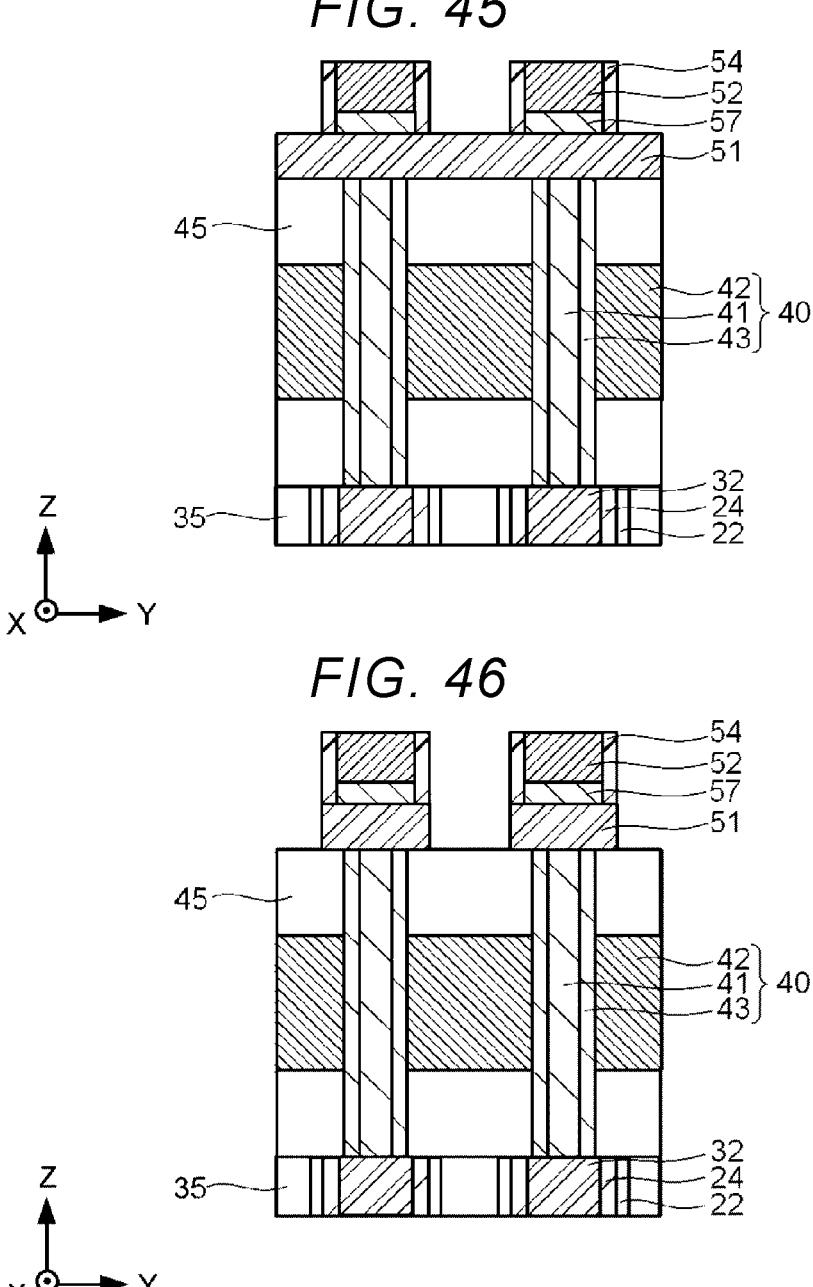
FIG. 45 is a cross-sectional schematic view illustrating the manufacturing method example of the sixth structural example.
FIG. 46 is a cross-sectional schematic view illustrating the manufacturing method example of the sixth structural example.

Next, as illustrated in FIG. 45, by removing a part of the protective film 54 in a thickness direction, a part of the conductive oxide layer 51 is exposed while the other part of the protective film 54 in contact with the side surface of the conductive layer 52 remains, and then, an exposed portion of the conductive oxide layer 51 is removed as illustrated in FIG. 46. The protective film 54 may be partially removed by, for example, reactive ion etching. The conductive oxide layer 51 may be partially removed by, for example, reactive ion etching, dry etching, or wet etching. In the case of forming a structure illustrated in FIG. 42, when removing the exposed portion of the conductive oxide layer 51, the conductive oxide layer 51 is partially etched until the side surface of the conductive oxide layer 51 is located inside the protective film 54.

Thereafter, by performing a heat treatment in an oxidizing atmosphere, oxygen can be introduced into the oxide semiconductor layer 41 via the conductive oxide layer 51. The oxidizing atmosphere contains, for example, oxygen, ozone, or water vapor. Further, the heat treatment may be performed under a nitrogen atmosphere.

Thereafter, the insulating layer 63 is formed. A known method may be used as a method for forming other components. The above is the description of the manufacturing method example of the sixth structural example.

Seventh Structural Example of Memory Cell Array

FIGS. 47 to 55 are cross-sectional schematic views illustrating a seventh structural example of the memory cell array. For the same portions as those in FIG. 41, the description of FIG. 41 is applicable as appropriate. Hereinafter, portions different from those in FIG. 41 will be described.

The oxide semiconductor layer 41 includes a protruding portion 41a protruding toward the conductive oxide layer 51 in the Z-axis direction. The protruding portion 41a is not in contact with the insulating layer 43.

Figure 47:
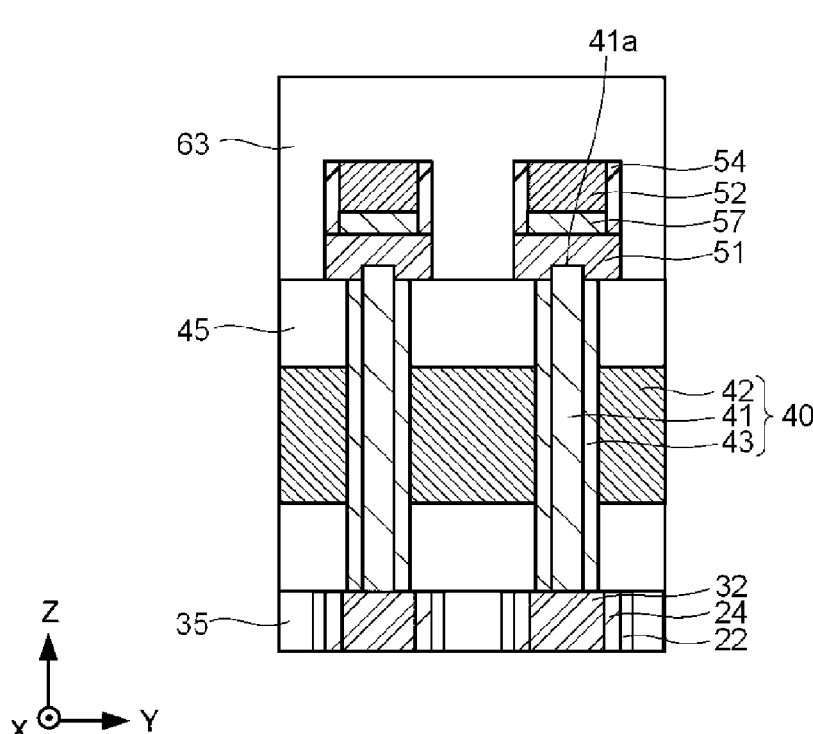
FIG. 47 is a cross-sectional schematic view illustrating a seventh structural example of the memory cell array.
Figure 48:
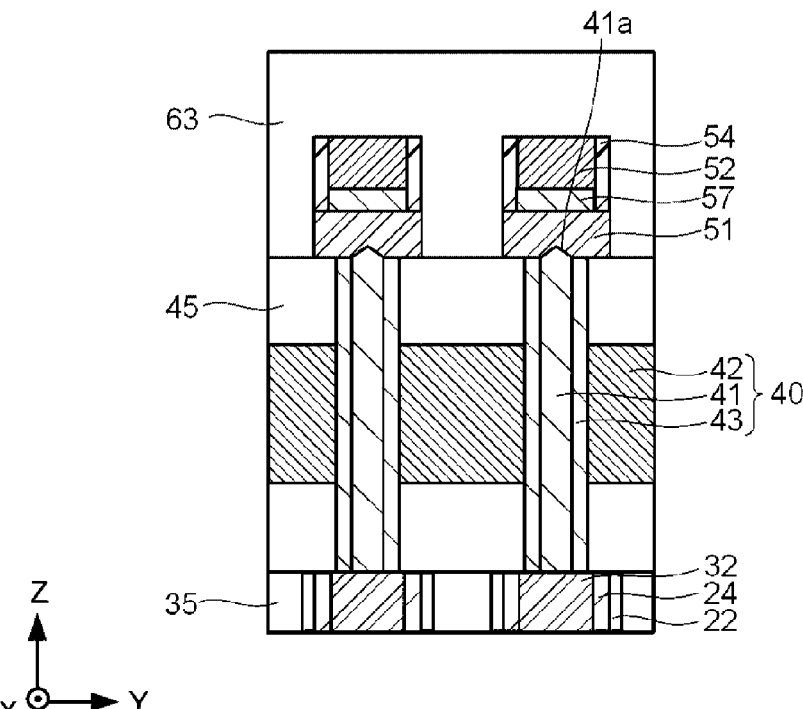
FIG. 48 is a cross-sectional schematic view illustrating the seventh structural example of the memory cell array.
Figure 49:
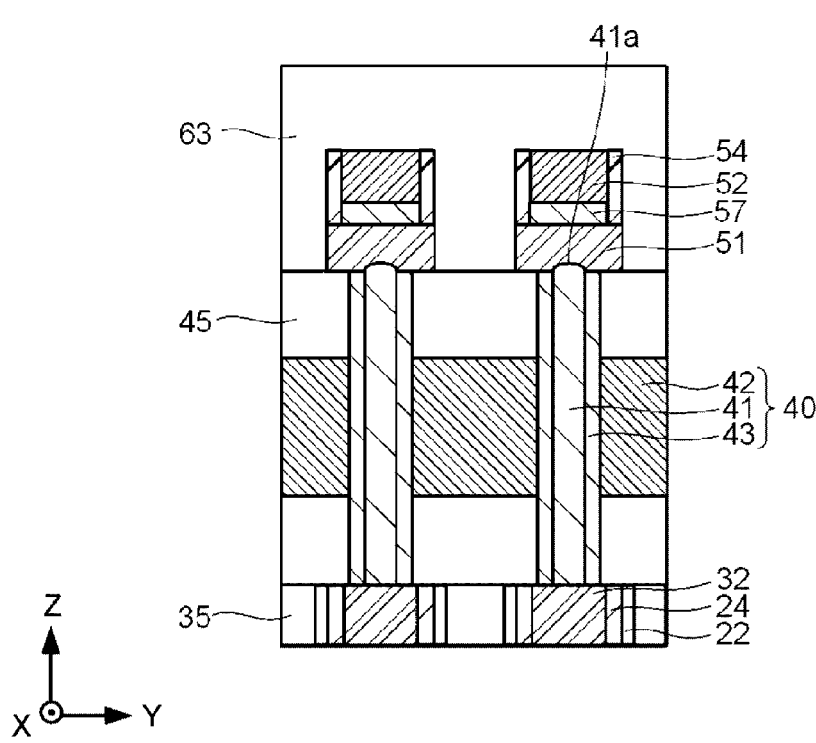
FIG. 49 is a cross-sectional schematic view illustrating the seventh structural example of the memory cell array.
Figure 50:
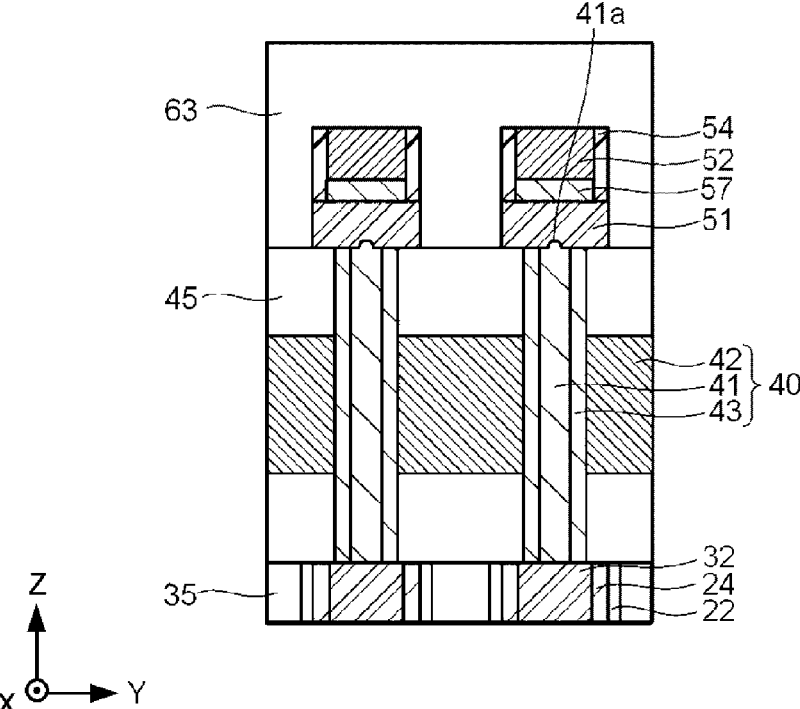
FIG. 50 is a cross-sectional schematic view illustrating the seventh structural example of the memory cell array.
Figure 51:
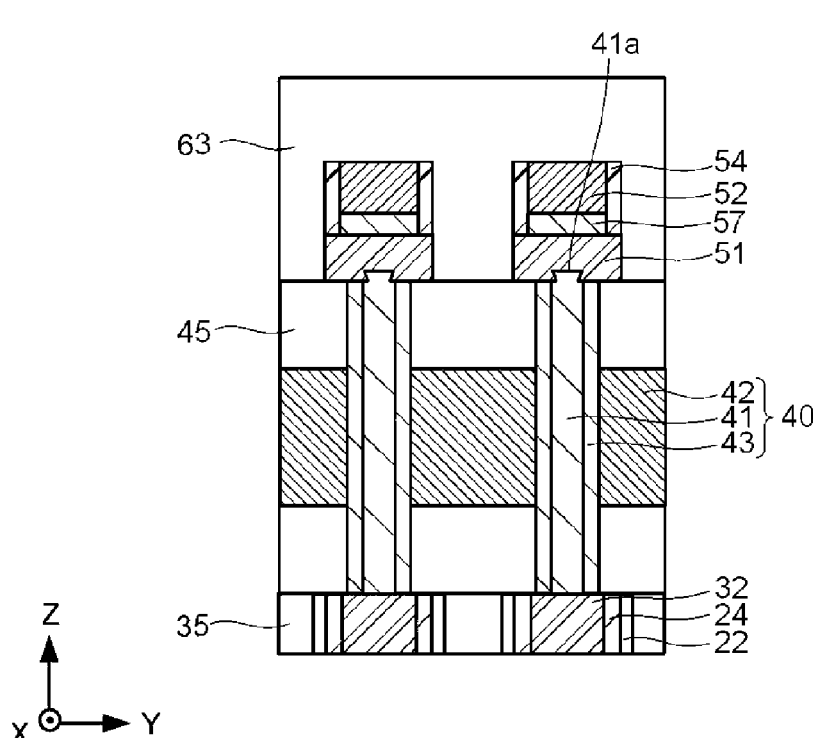
FIG. 51 is a cross-sectional schematic view illustrating the seventh structural example of the memory cell array.
Figure 52:
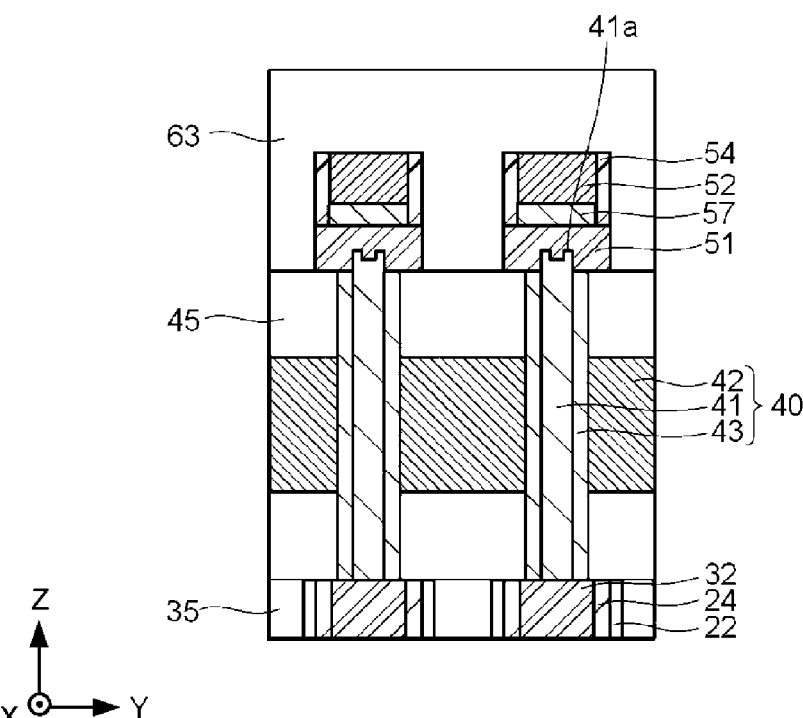
FIG. 52 is a cross-sectional schematic view illustrating the seventh structural example of the memory cell array.
Figure 53:
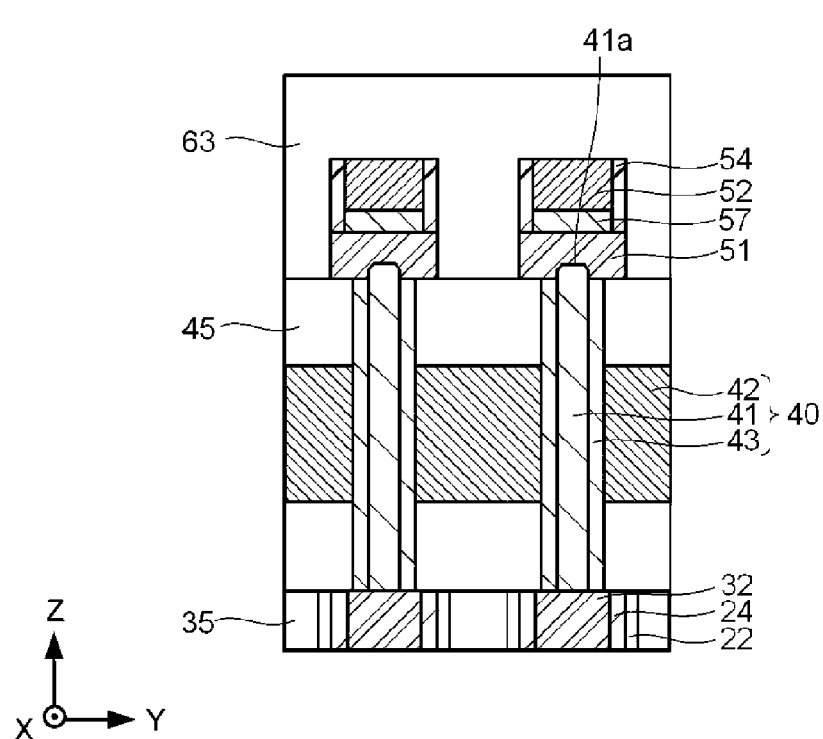
FIG. 53 is a cross-sectional schematic view illustrating the seventh structural example of the memory cell array.

A shape of the protruding portion 41a is not particularly limited. As illustrated in FIG. 47, the protruding portion 41a may have a quadrangular prism shape or a columnar shape. As illustrated in FIG. 48, the protruding portion 41a may have a quadrangular pyramid shape or a conical shape. As illustrated in FIG. 49, the protruding portion 41a may have a curved shape. As illustrated in FIG. 50, the protruding portion 41a may have a hemispherical shape. As illustrated in FIG. 51, the protruding portion 41a may have a shape with a constriction. As illustrated in FIG. 52, the protruding portion 41a may have an uneven shape. As illustrated in FIG. 53, the protruding portion 41a may have a chamfered quadrangular prism shape or columnar shape.

Figure 54:
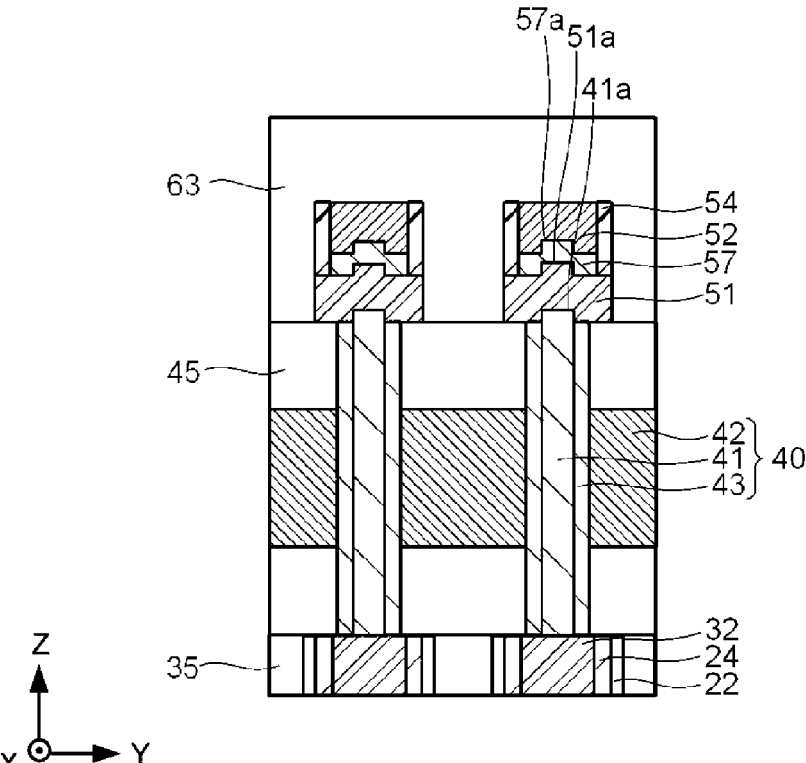
FIG. 54 is a cross-sectional schematic view illustrating the seventh structural example of the memory cell array.
Figure 55:
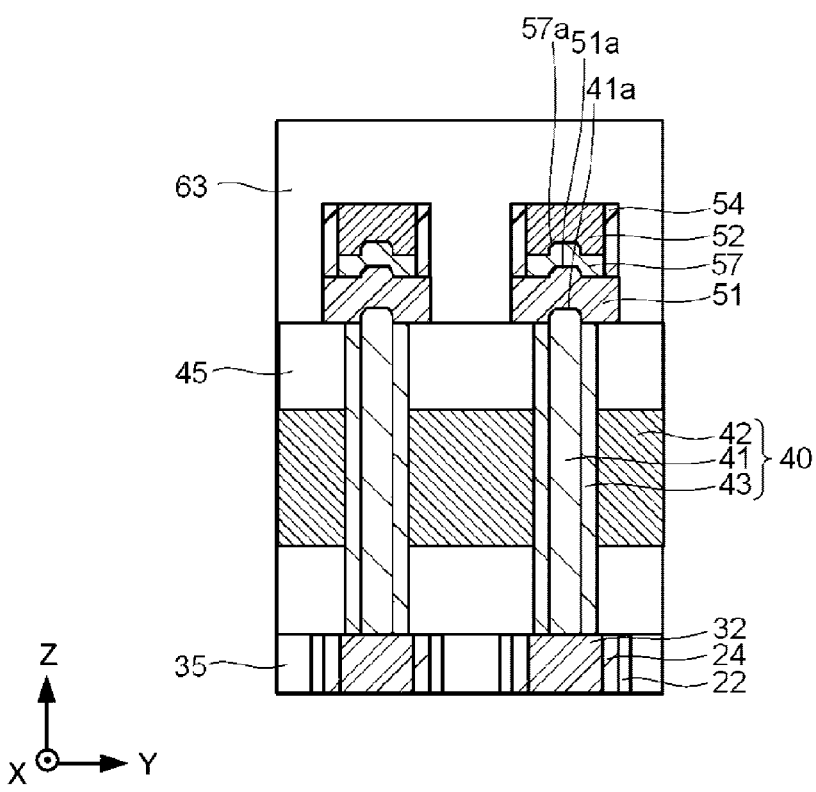
FIG. 55 is a cross-sectional schematic view illustrating the seventh structural example of the memory cell array.

When the oxide semiconductor layer 41 has the protruding portion 41a, as illustrated in FIG. 54, the conductive oxide layer 51 may have a protruding portion 51a on a side opposite to the protruding portion 41a, and the conductive layer 57 may have a protruding portion 57a on a side opposite to the protruding portion 51a. Shapes of the protruding portion 51a and the protruding portion 57a change in accordance with the shape of the protruding portion 41a. When the protruding portion 41a has the quadrangular prism shape or the columnar shape as illustrated in FIG. 54, the protruding portion 51a and the protruding portion 57a also have the quadrangular prism shape or the columnar shape. When the protruding portion 41a has the chamfered quadrangular prism shape or columnar shape as illustrated in FIG. 55, the protruding portion 51a and the protruding portion 57a also have the chamfered quadrangular prism shape or columnar shape.

A contact area between the oxide semiconductor layer 41 and the conductive oxide layer 51 can be increased by forming the protruding portion 41a in the oxide semiconductor layer 41. Therefore, in a process of supplying oxygen to the oxide semiconductor layer 41, the oxygen can be easily supplied to the oxide semiconductor layer 41 via the conductive oxide layer 51.

Figure 56:
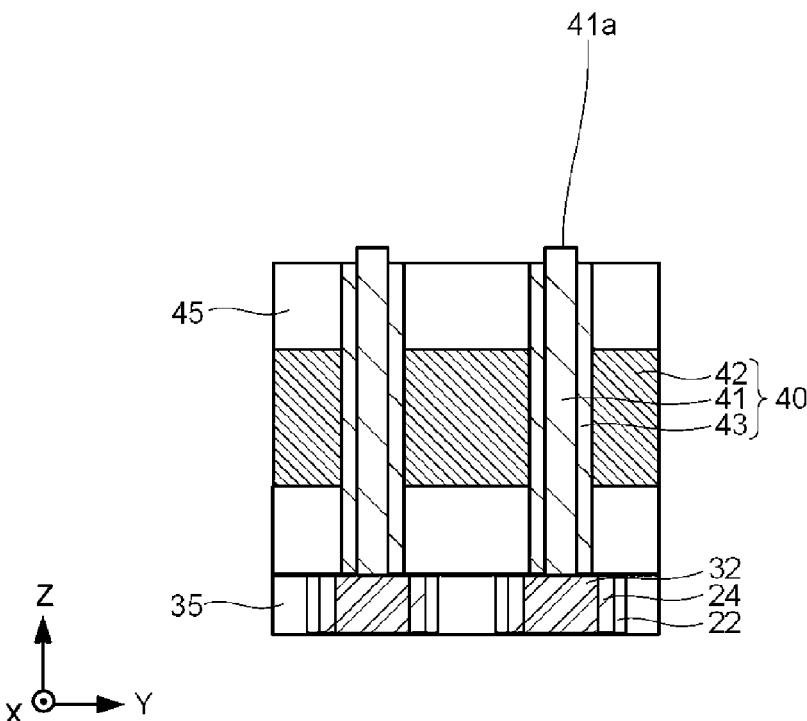
FIG. 56 is a cross-sectional schematic view illustrating a manufacturing method example of the seventh structural example.
Figure 57:
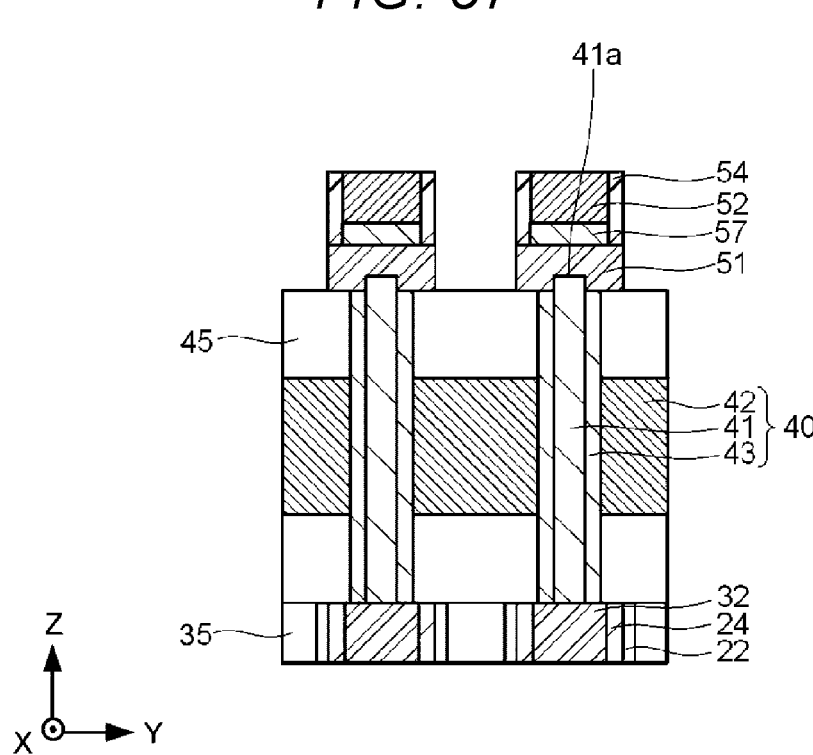
FIG. 57 is a cross-sectional schematic view illustrating the manufacturing method example of the seventh structural example.

Next, a manufacturing method example of the seventh structural example will be described with reference to FIGS. 56 and 57. FIGS. 56 and 57 are cross-sectional schematic views illustrating the manufacturing method example of the seventh structural example, and illustrate a Y-Z cross section. Here, as an example, a structure of the protruding portion 41a has a quadrangular prism shape or a columnar shape, and a manufacturing process from formation of the field effect transistor 40 to formation of the insulating layer 63 will be described. The descriptions of the same portions as those of the manufacturing method examples of the first structural example to the sixth structural example are omitted, and the descriptions of the manufacturing method examples of the first structural example to the sixth structural example is applicable as appropriate.

First, after the field effect transistor 40 is formed, the insulating layer 45 and the insulating layer 43 are partially removed along the Z-axis direction, so that a part of a side surface of the oxide semiconductor layer 41 is exposed to form the protruding portion 41a. The insulating layer 45 and the insulating layer 43 may be partially removed by, for example, dry etching, wet etching, and reactive ion etching. The protruding portion 41a can be processed to a desired shape by adjusting a type and a condition of the etching.

Thereafter, as illustrated in FIG. 57, the conductive oxide layer 51, the conductive layer 57, the conductive layer 52, and the protective film 54 are formed by the same method as the manufacturing method example of the sixth structural example.

Thereafter, by performing a heat treatment in an oxidizing atmosphere, oxygen can be introduced into the oxide semiconductor layer 41 via the conductive oxide layer 51. The oxidizing atmosphere contains, for example, oxygen, ozone, or water vapor. Further, the heat treatment may be performed under a nitrogen atmosphere.

Thereafter, the insulating layer 63 is formed. A known method may be used as a method for forming other components. The above is the description of the manufacturing method example of the seventh structural example.

Eighth Structural Example of Memory Cell Array

Figure 58:
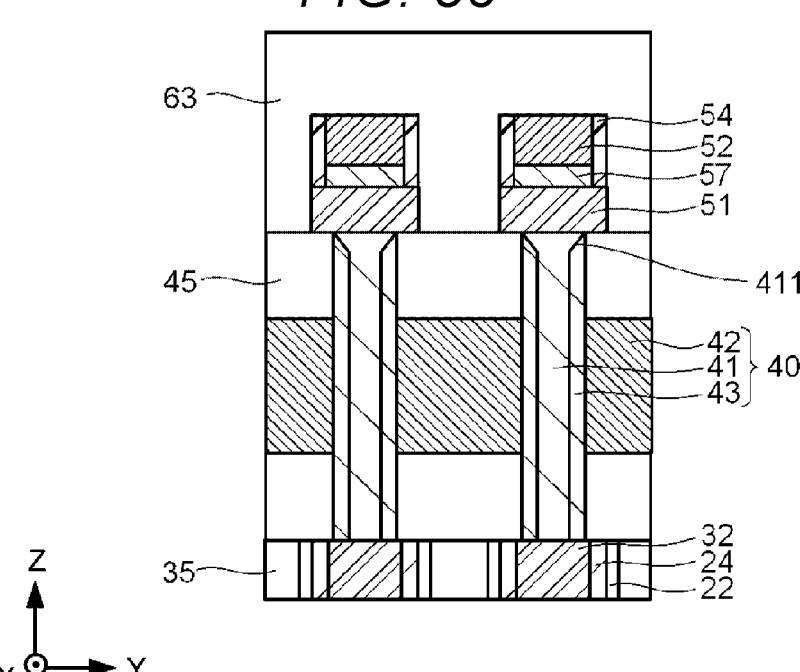
FIG. 58 is a cross-sectional schematic view illustrating an eighth structural example of the memory cell array.
Figures 59, 60:
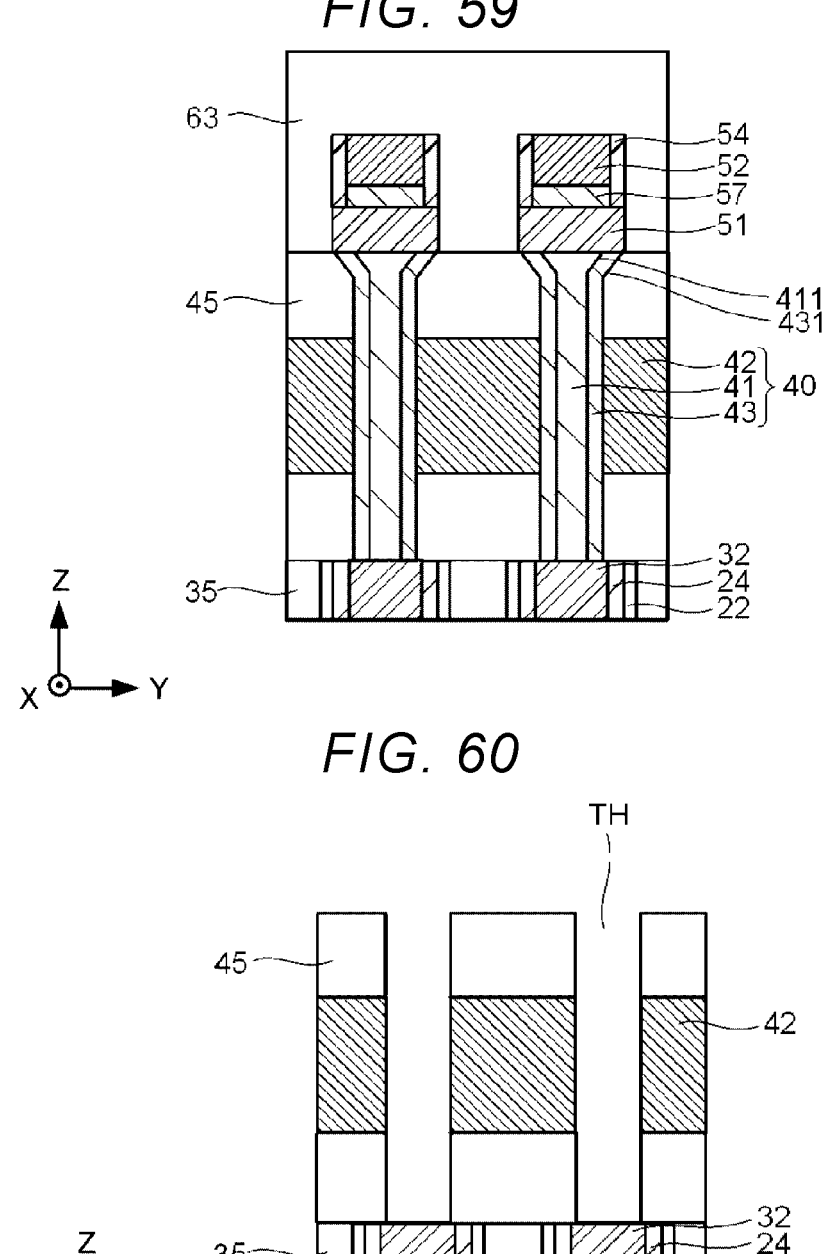
FIG. 59 is a cross-sectional schematic view illustrating the eighth structural example of the memory cell array.
FIG. 60 is a cross-sectional schematic view illustrating a manufacturing method example of the eighth structural example.

FIGS. 58 and 59 are cross-sectional schematic views illustrating an eighth structural example of the memory cell array. For the same portions as those in FIG. 41, the description of FIG. 41 is applicable as appropriate. Hereinafter, portions different from those in FIG. 41 will be described.

As illustrated in FIGS. 58 and 59, a portion of the oxide semiconductor layer 41 adjacent to the conductive oxide layer 51 includes a side surface 411 inclined toward a portion of the oxide semiconductor layer 41 overlapping the conductive layer 42.

As illustrated in FIG. 59, the insulating layer 43 may include a side surface 431 extending along the side surface 411.

A contact area between the oxide semiconductor layer 41 and the conductive oxide layer 51 can be increased by forming the side surface 411 in the oxide semiconductor layer 41. Therefore, in a process of supplying oxygen to the oxide semiconductor layer 41, the oxygen can be easily supplied to the oxide semiconductor layer 41 via the conductive oxide layer 51.

Next, a manufacturing method example of the eighth structural example will be described with reference to FIGS. 60 to 65. FIGS. 60 to 65 are cross-sectional schematic views illustrating the manufacturing method example of the eighth structural example, and illustrate a Y-Z cross section. Here, a manufacturing process from formation of the capacitor 20 to formation of the insulating layer 63 will be described as an example. The descriptions of the same portions as those of the manufacturing method examples of the first structural example to the seventh structural example are omitted, and the descriptions of the manufacturing method examples of the first structural example to the seventh structural example is applicable as appropriate.

First, after the capacitor 20 is formed, the conductive layer 42 and the insulating layer 45 are formed on the capacitor 20, and a part of the conductive layer 42 and a part of the insulating layer 45 are removed, so that an opening TH that penetrates the insulating layer 45 and the conductive layer 42 in the Z-axis direction is formed, and an upper surface of the conductive oxide layer 32 is exposed, as illustrated in FIG. 60. The conductive layer 42 and the insulating layer 45 may be processed by forming a mask on the insulating layer 45 using, for example, a photolithography technique and partially removing an exposed portion of the insulating layer 45 and the conductive layer 42 by etching using the mask. Examples of the etching include dry etching, wet etching, and the like.

Figure 61:
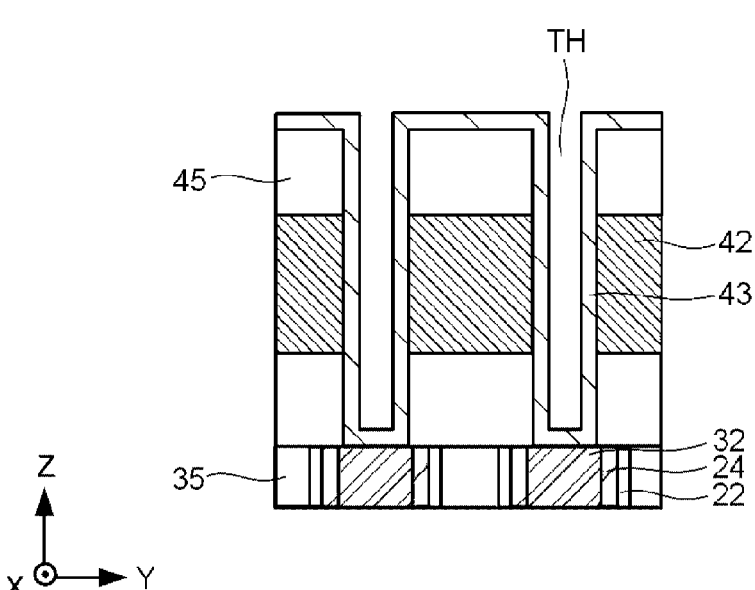
FIG. 61 is a cross-sectional schematic view illustrating the manufacturing method example of the eighth structural example.

Next, as illustrated in FIG. 61, the insulating layer 43 that covers the opening TH and the insulating layer 45 is formed. The insulating layer 43 may be formed using, for example, CVD.

Figure 62:
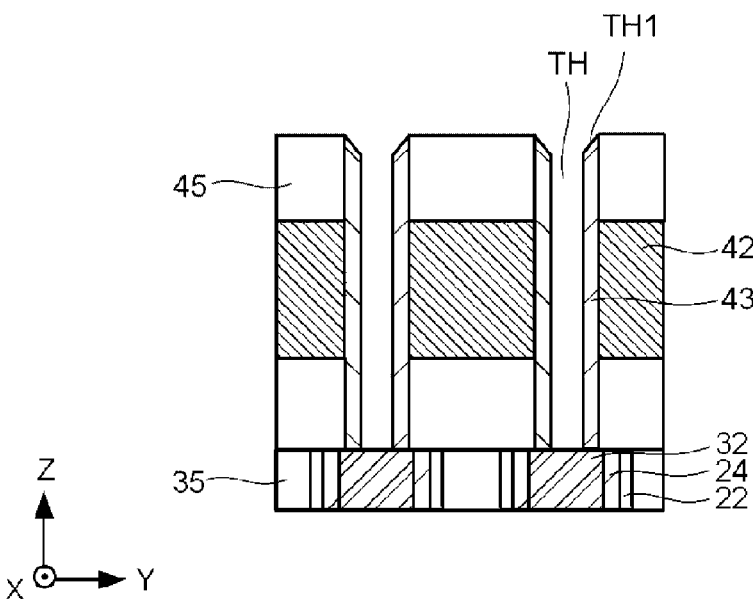
FIG. 62 is a cross-sectional schematic view illustrating the manufacturing method example of the eighth structural example.

Next, as illustrated in FIG. 62, the upper surface of the conductive oxide layer 32 and an upper surface of the insulating layer 45 are exposed by partially removing the insulating layer 43 in the Z-axis direction. The insulating layer 43 may be partially removed by, for example, etching using reactive ion etching. At this time, due to influence of the etching, a surface TH1 inclined to a portion of the insulating layer 43 overlapping the conductive layer 42 is formed at an upper end of an inner wall surface of the opening TH. The side surface 431 illustrated in FIG. 59 can be formed in the insulating layer 43 by adjusting a condition of the etching.

Figures 63, 64:
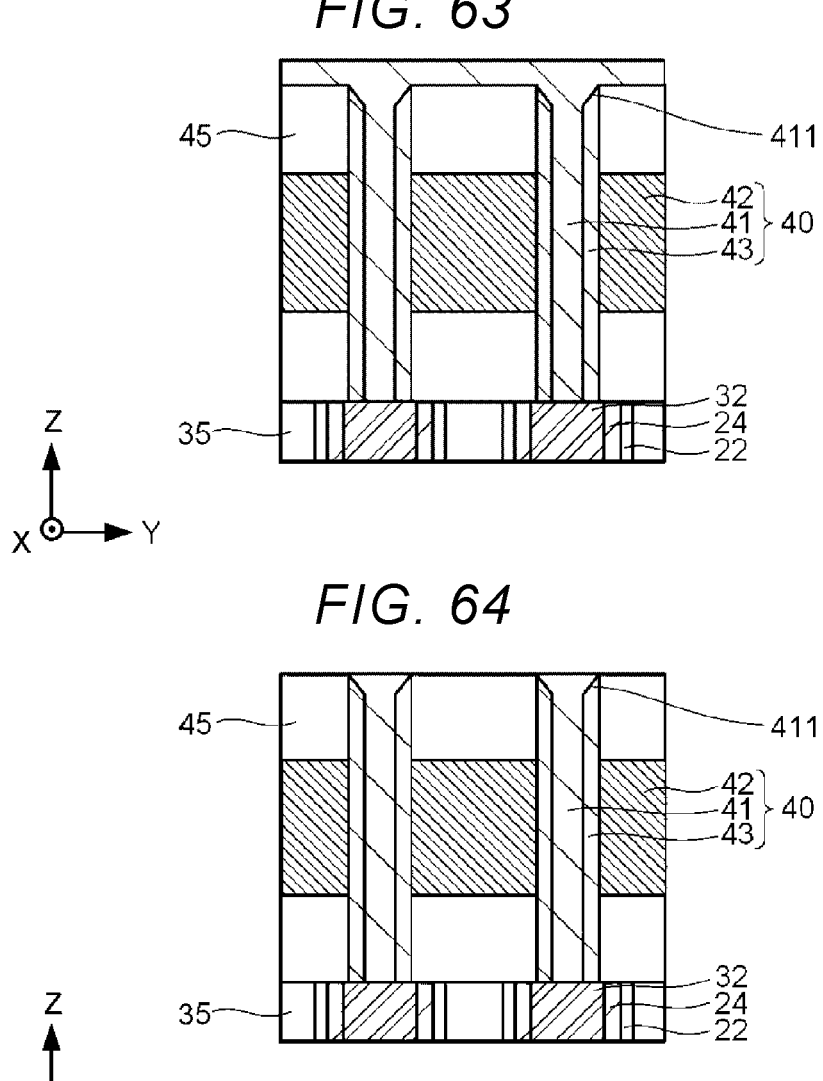
FIG. 63 is a cross-sectional schematic view illustrating the manufacturing method example of the eighth structural example.
FIG. 64 is a cross-sectional schematic view illustrating the manufacturing method example of the eighth structural example.

Next, as illustrated in FIG. 63, the oxide semiconductor layer 41 that fills the opening TH and covers the insulating layer 45 is formed. The oxide semiconductor layer 41 is formed along the surface TH1 illustrated in FIG. 62 to form the side surface 411. The oxide semiconductor layer 41 may be formed using, for example, sputtering.

Next, as illustrated in FIG. 64, the upper surface of the insulating layer 45 is exposed by partially removing the oxide semiconductor layer 41 along the Z-axis direction. The oxide semiconductor layer 41 may be partially removed by, for example, reactive ion etching.

Figure 65:
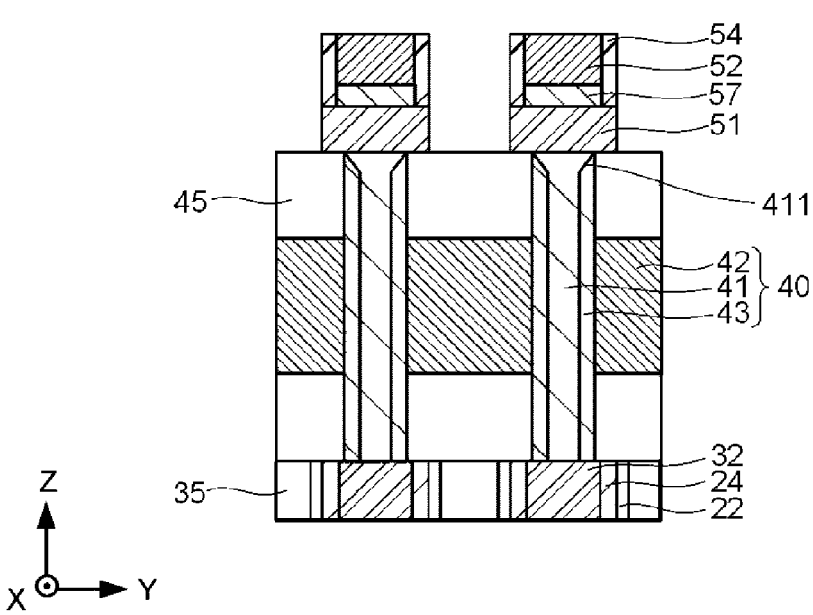
FIG. 65 is a cross-sectional schematic view illustrating the manufacturing method example of the eighth structural example.

Thereafter, as illustrated in FIG. 65, the conductive oxide layer 51, the conductive layer 57, the conductive layer 52, and the protective film 54 are formed by the same method as the manufacturing method example of the sixth structural example.

Thereafter, by performing a heat treatment in an oxidizing atmosphere, oxygen can be introduced into the oxide semiconductor layer 41 via the conductive oxide layer 51. The oxidizing atmosphere contains, for example, oxygen, ozone, or water vapor. Further, the heat treatment may be performed under a nitrogen atmosphere.

Thereafter, the insulating layer 63 is formed. A known method may be used as a method for forming other components. The above is the description of the manufacturing method example of the eighth structural example.

Ninth Structural Example of Memory Cell Array

FIGS. 66 to 73 are cross-sectional schematic views illustrating a ninth structural example of the memory cell array. The sixth structural example of the memory cell array does not include the insulating layer 53 and the protective film 55 illustrated in FIG. 4, while further includes the conductive layer 57. For the same portions as those in FIG. 4, the description of FIG. 4 is applicable as appropriate. Hereinafter, portions different from those in FIG. 4 will be described.

Figure 66:
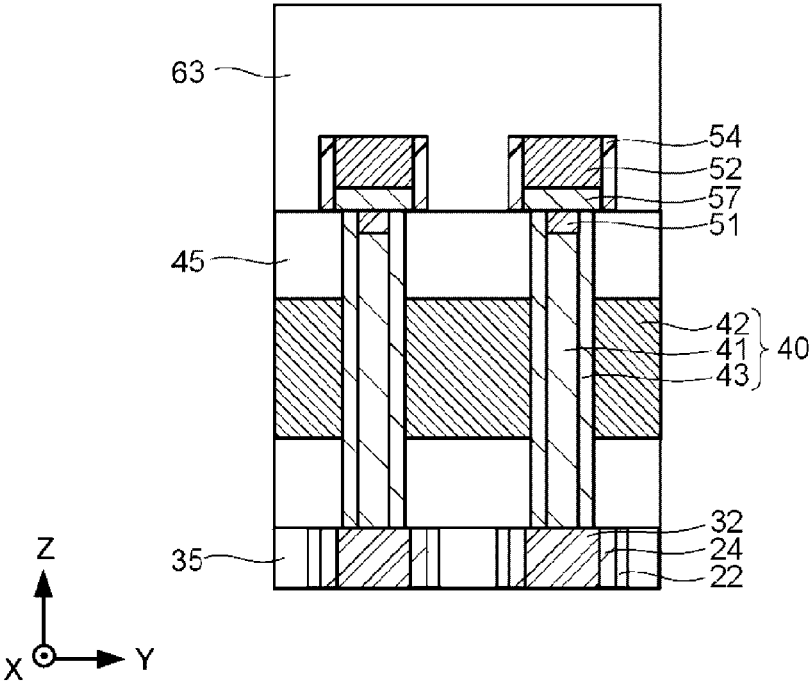
FIG. 66 is a cross-sectional schematic view illustrating a ninth structural example of the memory cell array.

As illustrated in FIG. 66, the side surface of the conductive oxide layer 51 is in contact with the insulating layer 43.

The conductive layer 52 is provided on the conductive layer 57. The conductive layer 52 overlaps the oxide semiconductor layer 41 when viewed from the Z-axis direction. The upper surface of the conductive layer 52 is in contact with the insulating layer 63. As other descriptions of the conductive layer 52, the descriptions of the first structural example is applicable as appropriate.

The protective film 54 covers the side surface of the conductive layer 57 and the side surface of the conductive layer 52. As other descriptions of the protective film 54, the descriptions of the first structural example is applicable as appropriate.

The conductive layer 57 is provided between the conductive oxide layer 51 and the conductive layer 52. The conductive layer 57 contains, for example, titanium and nitrogen. By forming the conductive layer 57, it is possible to prevent diffusion of oxygen from the conductive oxide layer 51 to the conductive layer 52. As other descriptions of the conductive layer 57, the descriptions of the second structural example is applicable as appropriate.

As illustrated in FIG. 66, at least a part of the side surface of the conductive oxide layer 51 is in contact with the insulating layer 43, and the protective film 54 is formed, so that it is possible to prevent the oxygen from being released from the oxide semiconductor layer 41 via the conductive oxide layer 51.

Figure 67:
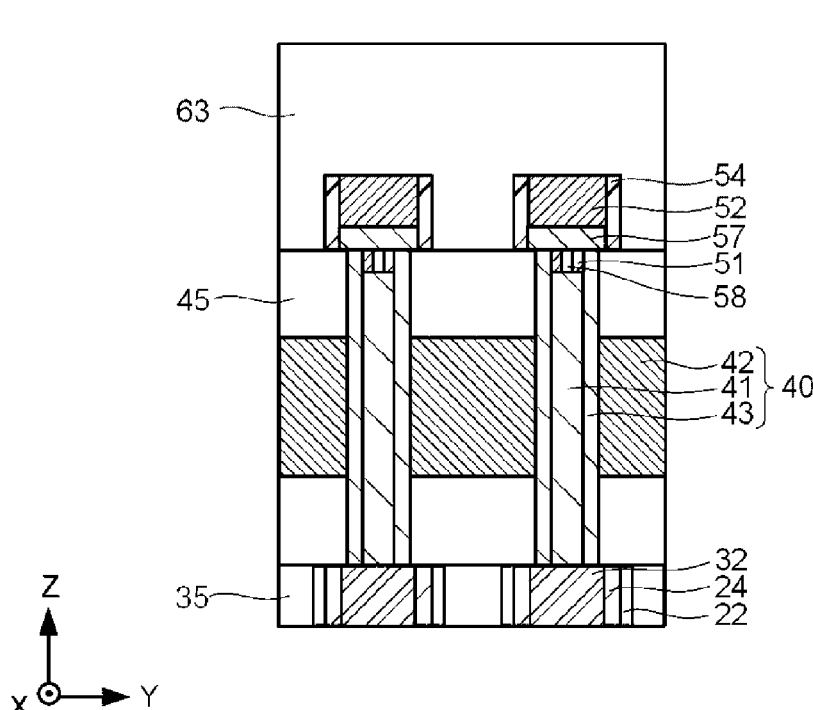
FIG. 67 is a cross-sectional schematic view illustrating the ninth structural example of the memory cell array.

The memory cell array illustrated in FIG. 67 further includes a layer 58. The layer 58 is surrounded by the conductive oxide layer 51 and extends from the conductive layer 57 toward the oxide semiconductor layer 41. The layer 58 contains, for example, silicon, aluminum, or oxygen.

Figure 68:
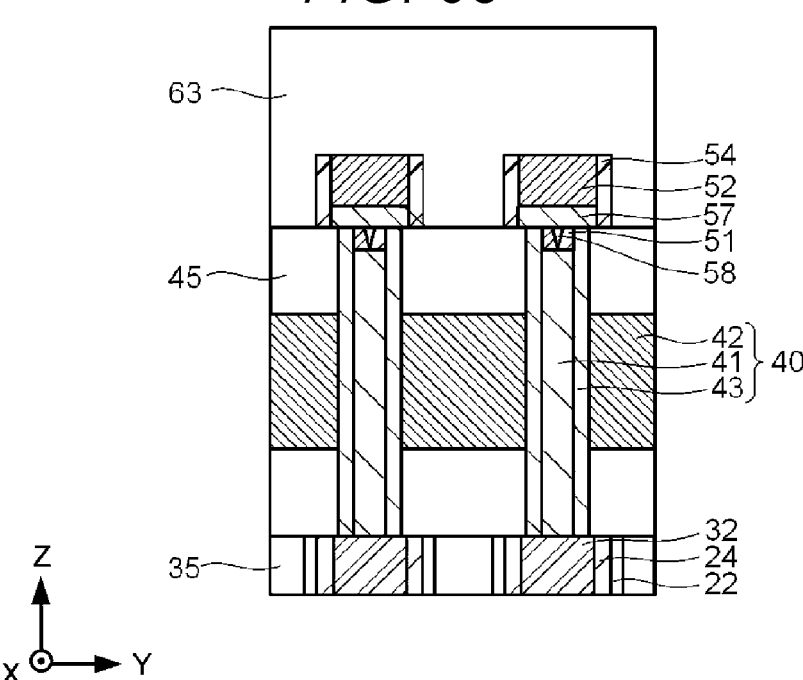
FIG. 68 is a cross-sectional schematic view illustrating the ninth structural example of the memory cell array.
Figure 69:
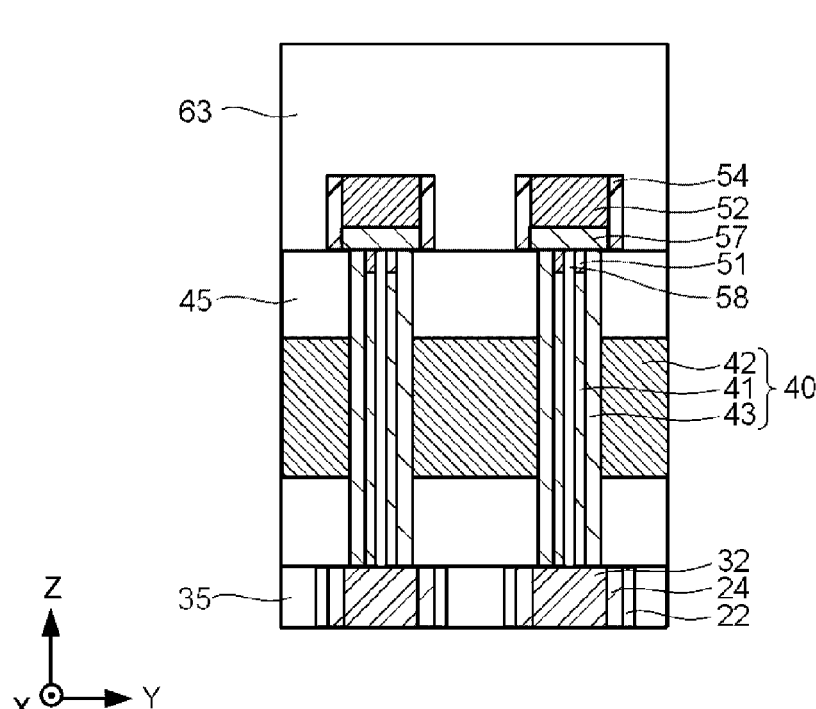
FIG. 69 is a cross-sectional schematic view illustrating the ninth structural example of the memory cell array.
Figure 70:
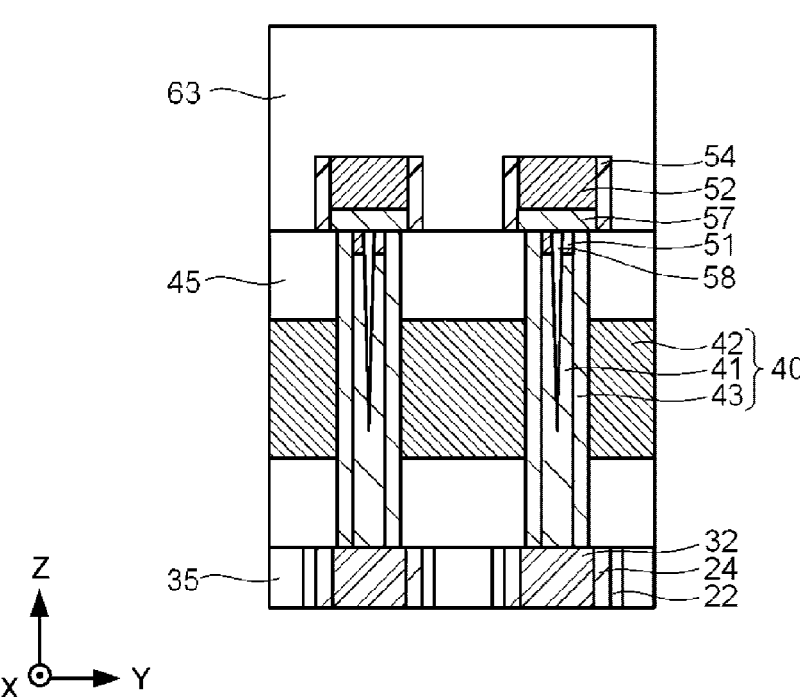
FIG. 70 is a cross-sectional schematic view illustrating the ninth structural example of the memory cell array.

A shape of the layer 58 is not particularly limited. As illustrated in FIG. 67, the layer 58 may have a quadrangular prism shape or a columnar shape. As illustrated in FIG. 68, the layer 58 may have a quadrangular pyramid shape or a conical shape. As illustrated in FIG. 69, the layer 58 may extend in the Z-axis direction into the oxide semiconductor layer 41 and reach the conductive oxide layer 32. As illustrated in FIG. 70, the layer 58 may have a quadrangular pyramid shape or a conical shape and extend in the Z-axis direction into the oxide semiconductor layer 41.

A contact area between the oxide semiconductor layer 41 and the conductive oxide layer 51 can be reduced by forming the layer 58. Accordingly, adhesion between the oxide semiconductor layer 41 and the conductive oxide layer 51 can be increased.

Figures 71, 72:
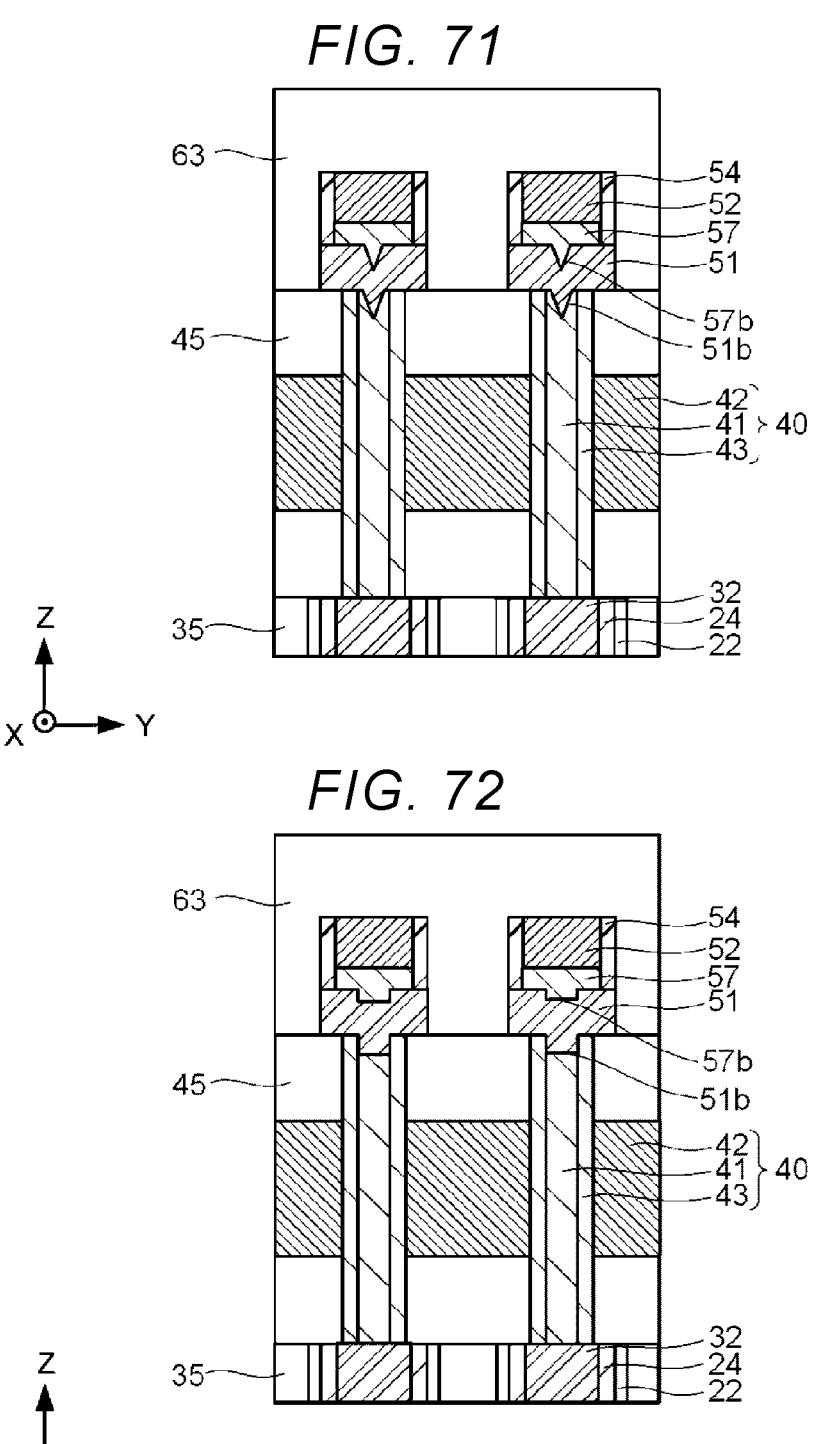
FIG. 71 is a cross-sectional schematic view illustrating the ninth structural example of the memory cell array.
FIG. 72 is a cross-sectional schematic view illustrating the ninth structural example of the memory cell array.

As illustrated in FIG. 71, the conductive oxide layer 51 may have a protruding portion 51b protruding toward the oxide semiconductor layer 41 in the Z-axis direction.

Figure 73:
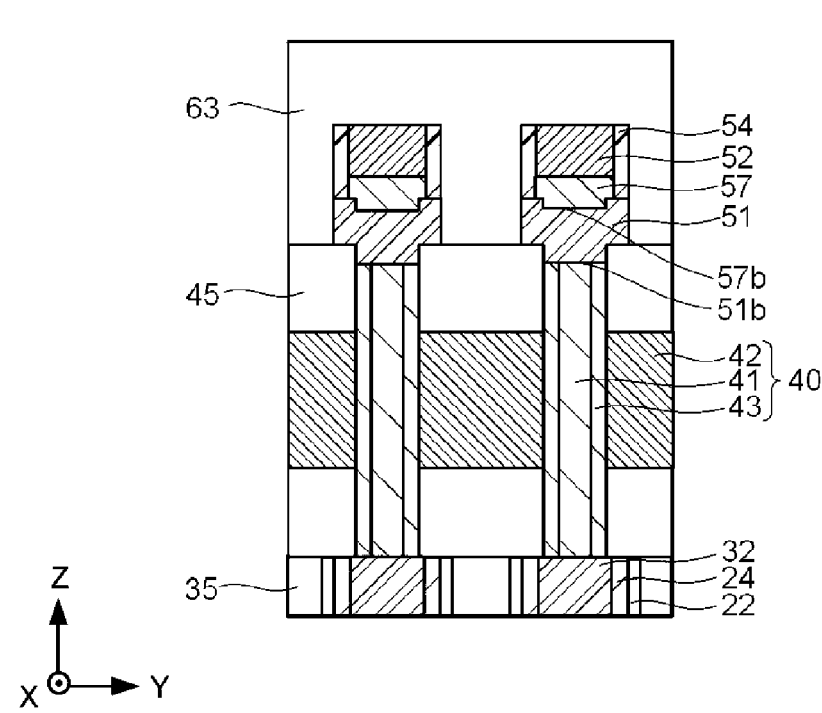
FIG. 73 is a cross-sectional schematic view illustrating the ninth structural example of the memory cell array.

A shape of the protruding portion 51b is not particularly limited. As illustrated in FIG. 71, the protruding portion 51b may have a quadrangular pyramid shape or a conical shape. As illustrated in FIG. 72, the protruding portion 51b may have a quadrangular prism shape or a columnar shape. As illustrated in FIG. 73, the protruding portion 51b may have a quadrangular prism shape or a columnar shape and be in contact with the insulating layer 43 in the Z-axis direction.

As illustrated in FIGS. 71 to 73, when the conductive oxide layer 51 has the protruding portion 51b, the conductive layer 57 may have a protruding portion 57b on a side opposite to the protruding portion 51b. A shape of the protruding portion 57b changes in accordance with the shape of the protruding portion 51b. When the protruding portion 51b has the quadrangular pyramid shape or the conical shape as illustrated in FIG. 71, the protruding portion 57b also has the quadrangular pyramid shape or the conical shape. When the protruding portion 51b has the quadrangular prism shape or the columnar shape as illustrated in FIG. 72 or 73, the protruding portion 57b also has the quadrangular prism shape or the columnar shape.

The adhesion between the oxide semiconductor layer 41 and the conductive oxide layer 51 can be increased by forming the protruding portion 51b in the conductive oxide layer 51.

Figure 74:
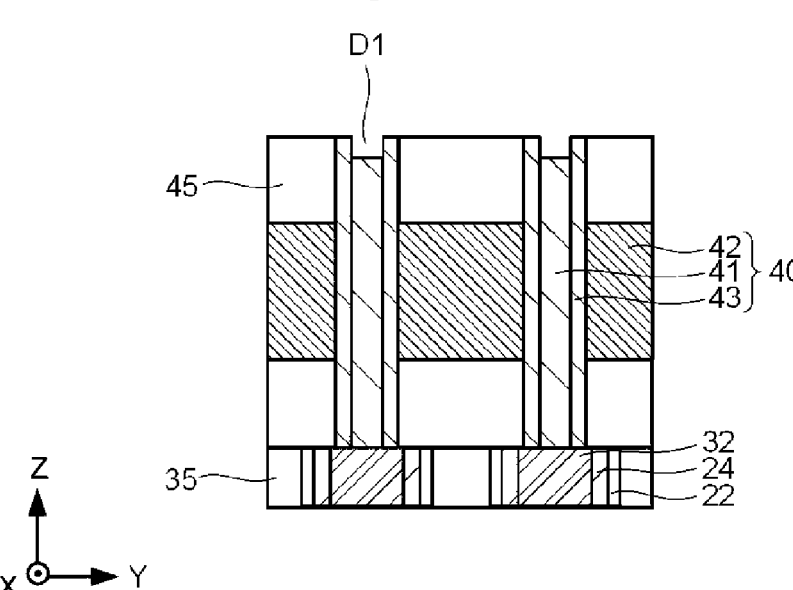
FIG. 74 is a cross-sectional schematic view illustrating a manufacturing method example of the ninth structural example.
Figure 75:
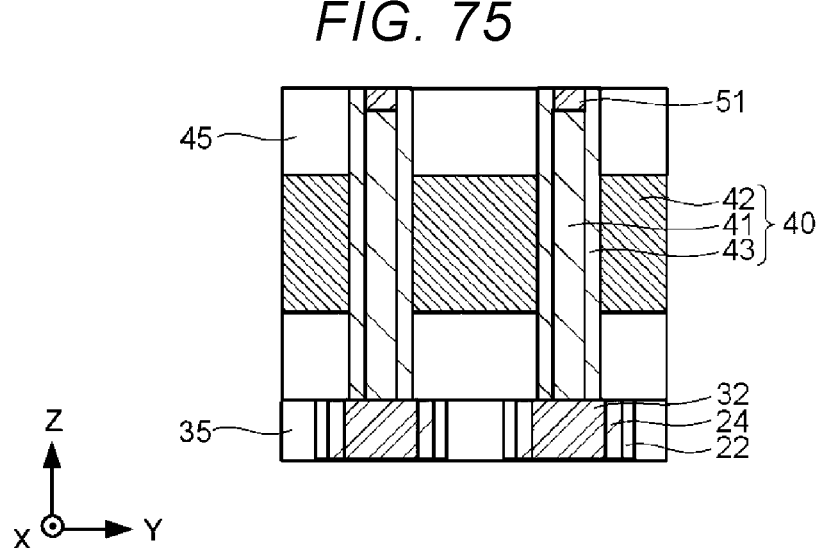
FIG. 75 is a cross-sectional schematic view illustrating the manufacturing method example of the ninth structural example.

Next, a manufacturing method example of the ninth structural example will be described with reference to FIGS. 74 and 75. FIGS. 74 and 75 are cross-sectional schematic views illustrating the manufacturing method example of the ninth structural example, and illustrate a Y-Z cross section. Here, as an example, a structure illustrated in FIG. 66 is formed, and a manufacturing process from formation of the field effect transistor 40 to formation of the insulating layer 63 will be described. The descriptions of the same portions as those of the manufacturing method examples of the first structural example to the eighth structural example are omitted, and the descriptions of these manufacturing method examples is applicable as appropriate.

As illustrated in FIG. 74, the recessed portion D1 is formed on the field effect transistor 40 and the oxide semiconductor layer 41, then, the conductive oxide layer 51 that covers the insulating layer 45, the insulating layer 43, and the recessed portion D1 is formed, and a part of the conductive oxide layer 51 is removed in a thickness direction, so that an upper surface of the insulating layer 45 is exposed as illustrated in FIG. 75. The recessed portion D1 can be formed by further removing a part of the oxide semiconductor layer 41 from the same height as the upper surface of the insulating layer 45 in the thickness direction when forming the oxide semiconductor layer 41 of the field effect transistor 40. The oxide semiconductor layer 41 may be partially removed by, for example, reactive ion etching or CMP.

In the case of the structure illustrated in FIGS. 67 to 70, next, an opening that penetrates the conductive oxide layer 51 or penetrates the oxide semiconductor layer 41 and the conductive oxide layer 51 is formed, and the layer 58 is formed so as to fill the opening.

Thereafter, the conductive layer 57, the conductive layer 52, and the protective film 54 are formed by the same method as the manufacturing method example of the sixth structural example. Thereafter, the insulating layer 63 is formed. A known method may be used as a method for forming other components. The above is the description of the manufacturing method example of the ninth structural example.

The first to ninth structure examples and the manufacturing method examples thereof may be combined with one another as appropriate. For example, in the seventh, eighth, or ninth structural example, the insulating layer 53, the protective film 55, and the protective film 56 may be provided.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
an oxide semiconductor layer extending in a first direction;
a gate electrode overlapping the oxide semiconductor layer in a second direction, the second direction intersecting the first direction;
a gate insulating film disposed between the gate electrode and the oxide semiconductor layer;
a first conductive layer disposed on the oxide semiconductor layer in the first direction, the first conductive layer containing a conductive oxide;
a second conductive layer disposed on the first conductive layer in the first direction, the second conductive layer containing a metal element;
a first protective film in contact with a side surface of the second conductive layer; and
a second protective film in contact with a part of a side surface of the first conductive layer, wherein the first protective film and the second protective film each contain a material having an oxygen diffusion coefficient smaller than that of the second conductive layer, wherein the first conductive layer is disposed between the oxide semiconductor layer and the second conductive layer along the first direction, and wherein the first protective film is disposed between the second conductive layer and the second protective film along the second direction.

2. The semiconductor device according to claim 1, further comprising:

a third protective film covering the second protective film.

3. The semiconductor device according to claim 1, wherein the first conductive layer has an uneven surface, and at least a part of the uneven surface is in contact with the second protective film.

4. A semiconductor device, comprising:

an oxide semiconductor layer extending in a first direction;

a gate electrode overlapping the oxide semiconductor layer in a second direction, the second direction intersecting the first direction;

a gate insulating film disposed between the gate electrode and the oxide semiconductor layer;

a first conductive layer disposed on the oxide semiconductor layer in the first direction, the first conductive layer containing a conductive oxide;

a second conductive layer disposed on a part of the first conductive layer in the first direction, the second conductive layer containing a metal element; and a protective film disposed over the oxide semiconductor layer in the first direction, in contact with a side surface of the second conductive layer, and in contact with a part of a side surface of the first conductive layer.

5. The semiconductor device according to claim 4, wherein the protective film is in contact with an upper surface of another part of the first conductive layer.

6. The semiconductor device according to claim 1, wherein the oxide semiconductor layer has a first protruding portion protruding toward the first conductive layer.

7. The semiconductor device according to claim 1, wherein the first conductive layer includes a second protruding portion protruding toward the oxide semiconductor layer.

8. The semiconductor device according to claim 1, wherein a portion of the oxide semiconductor layer adjacent to the first conductive layer has a side surface inclined with respect to a side surface of a portion of the oxide semiconductor layer overlapping the gate electrode.

9. The semiconductor device according to claim 1, wherein at least a part of the side surface of the first conductive layer is in contact with the gate insulating film.

10. The semiconductor device according to claim 9, further comprising:

a layer extending from the first conductive layer toward the oxide semiconductor layer.

11. The semiconductor device according to claim 1, further comprising:

a metal compound layer disposed between the first conductive layer and the second conductive layer.

12. A semiconductor memory device, comprising:

an oxide semiconductor layer extending in a first direction;

a gate electrode overlapping the oxide semiconductor layer in a second direction, the second direction intersecting the first direction;

a gate insulating film disposed between the gate electrode and the oxide semiconductor layer;

a first conductive layer disposed on the oxide semiconductor layer in the first direction, the first conductive layer containing a conductive oxide;

a second conductive layer disposed on the first conductive layer in the first direction, the second conductive layer containing a metal element;

a first protective film in contact with a side surface of the second conductive layer;

a second protective film in contact with a part of a side surface of the first conductive layer; and a capacitor disposed below the oxide semiconductor layer and electrically connected to the oxide semiconductor layer, wherein the first protective film and the second protective film each contain a material having an oxygen diffusion coefficient smaller than that of the second conductive layer, wherein the first conductive layer is disposed between the oxide semiconductor layer and the second conductive layer along the first direction, and wherein the first protective film is disposed between the second conductive layer and the second protective film along the second direction.

13. The semiconductor memory device according to claim 12, further comprising:

a third protective film covering the second protective film.

14. The semiconductor memory device according to claim 12, wherein the first conductive layer has an uneven surface, and at least a part of the uneven surface is in contact with the second protective film.

15. A semiconductor memory device, comprising:

an oxide semiconductor layer extending in a first direction;

a gate electrode overlapping the oxide semiconductor layer in a second direction, the second direction intersecting the first direction;

a gate insulating film disposed between the gate electrode and the oxide semiconductor layer;

a first conductive layer disposed on the oxide semiconductor layer in the first direction, the first conductive layer containing a conductive oxide;

a second conductive layer disposed on a part of the first conductive layer in the first direction, the second conductive layer containing a metal element;

a protective film disposed over the oxide semiconductor layer in the first direction, in contact with a side surface of the second conductive layer, and in contact with a part of a side surface of the first conductive layer; and a capacitor disposed below the oxide semiconductor layer and electrically connected to the oxide semiconductor layer.

16. The semiconductor memory device according to claim 15, wherein the protective film is in contact with an upper surface of another part of the first conductive layer.

17. The semiconductor memory device according to claim 12, wherein the oxide semiconductor layer has a first protruding portion protruding toward the first conductive layer.

18. The semiconductor memory device according to claim 12, wherein the first conductive layer has a second protruding portion protruding toward the oxide semiconductor layer.

19. The semiconductor memory device according to claim 12, wherein a portion of the oxide semiconductor layer adjacent to the first conductive layer has a side surface inclined with respect to a side surface of a portion of the oxide semiconductor layer overlapping the gate electrode.

20. The semiconductor memory device according to claim 12, wherein at least a part of the side surface of the first conductive layer is in contact with the gate insulating film.

21. The semiconductor memory device according to claim 20, further comprising:

a layer extending from the first conductive layer toward the oxide semiconductor layer.

22. The semiconductor memory device according to claim 12, further comprising:

a metal compound layer disposed between the first conductive layer and the second conductive layer.

* * * * *